US010256279B2

(12) United States Patent
Yamazaki et al.

(10) Patent No.: US 10,256,279 B2
(45) Date of Patent: Apr. 9, 2019

(54) DISPLAY DEVICE, DISPLAY MODULE, ELECTRONIC DEVICE, AND METHOD FOR MANUFACTURING THE DISPLAY DEVICE

(71) Applicant: Semiconductor Energy Laboratory Co., Ltd., Kanagawa-ken (JP)

(72) Inventors: Shunpei Yamazaki, Tokyo (JP); Daisuke Kubota, Kanagawa (JP); Yusuke Kubota, Osaka (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/625,000

(22) Filed: Jun. 16, 2017

(65) Prior Publication Data

US 2017/0365648 A1    Dec. 21, 2017

(30) Foreign Application Priority Data

Jun. 17, 2016 (JP) ................. 2016-120951

(51) Int. Cl.
*G02F 1/1335* (2006.01)
*H01L 27/32* (2006.01)
(Continued)

(52) U.S. Cl.
CPC ........ *H01L 27/3232* (2013.01); *G02F 1/1368* (2013.01); *G02F 1/133553* (2013.01);
(Continued)

(58) Field of Classification Search
CPC ................. H01L 27/3232; G02F 1/133553
(Continued)

(56) References Cited

U.S. PATENT DOCUMENTS 6,292,439 B1 *  9/2001  Akiba ............... G02F 1/133514
                                                    368/84
6,714,268 B2   3/2004  Wang et al.
(Continued)

FOREIGN PATENT DOCUMENTS

JP    2001-066593 A    3/2001
JP    2002-196702 A    7/2002
(Continued)

OTHER PUBLICATIONS

Shieh, H-P., "Transflective Display by Hybrid OLED and LCD," LEOS 2005 (IEEE Lasers and Electro-Optics Society Annual Meeting), Oct. 22. 2005, pp. 650-651, IEEE.
(Continued)

*Primary Examiner* — Lucy Chien
(74) *Attorney, Agent, or Firm* — Husch Blackwell LLP

(57) ABSTRACT

A display device with high visibility regardless of the ambient brightness is provided. The display device includes a first display element, a second display element, a first transistor, and a second transistor. The first display element has a function of reflecting visible light. The second display element has a function of emitting visible light. The first transistor has a function of controlling the driving of the first display element. The second transistor has a function of controlling the driving of the second display element. The first transistor is positioned closer to a display surface side of the display device than the first display element is. The first display element is positioned closer to the display surface side of the display device than the second display element and the second transistor are.

16 Claims, 20 Drawing Sheets

(51) Int. Cl.
*G02F 1/1362* (2006.01)
*G02F 1/1368* (2006.01)
G02F 1/1333 (2006.01)
H01L 27/12 (2006.01)
H01L 29/786 (2006.01)

(52) U.S. Cl.
CPC .... *G02F 1/136286* (2013.01); *H01L 27/3262* (2013.01); *G02F 2001/13685* (2013.01); *G02F 2001/133354* (2013.01); *G02F 2001/133565* (2013.01); *G02F 2201/44* (2013.01); *G02F 2201/52* (2013.01); *G02F 2203/02* (2013.01); *H01L 27/1225* (2013.01); *H01L 29/7869* (2013.01); *H01L 2227/323* (2013.01)

(58) Field of Classification Search
USPC .......................................................... 349/114
See application file for complete search history.

(56) References Cited

U.S. PATENT DOCUMENTS

| | | | |
|---|---|---|---|
| 6,747,289 B2 * | 6/2004 | Yamazaki | G02F 1/133553 257/59 |
| 7,038,641 B2 | 5/2006 | Hirota et al. | |
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,385,654 B2 | 6/2008 | Mitsui et al. | |
| 7,656,477 B2 * | 2/2010 | Sawayama | G02F 1/133553 349/113 |
| 8,854,286 B2 * | 10/2014 | Yamazaki | G09G 3/3648 257/43 |
| 2003/0201960 A1 | 10/2003 | Fujieda | |
| 2006/0072047 A1 | 4/2006 | Sekiguchi | |
| 2007/0085484 A1 * | 4/2007 | Hsu | G09G 3/3216 315/169.2 |
| 2008/0180618 A1 | 7/2008 | Fujieda | |
| 2010/0171905 A1 | 7/2010 | Huang et al. | |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2011-191750 A | 9/2011 |
| JP | 2013-221965 A | 10/2013 |
| JP | 2014-197522 A | 10/2014 |
| WO | WO 2004-053819 A1 | 6/2004 |

OTHER PUBLICATIONS

Lee, J-H. et al., "High Ambient-Contrast-Ratio Display Using Tandem Reflective Liquid Crystal Display and Organic Light-Emitting Device," Optics Express, Nov. 14, 2005, vol. 13, No. 23, pp. 9431-9438.

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2018, vol. 47, pp. 735-738.

Ohide, T. et al., "Application of Transfer Technology to Manufacturing of Transmissive OLED and Reflective LC Hybrid (TR-Hybrid) Display," SID DIGEST '16: SID International Symposium Digest of Technical Papers, May 22, 2016, vol 47, pp. 1002-1004.

* cited by examiner

DISPLAY DEVICE, DISPLAY MODULE, ELECTRONIC DEVICE, AND METHOD FOR MANUFACTURING THE DISPLAY DEVICE

BACKGROUND OF THE INVENTION

1. Field of the Invention

One embodiment of the present invention relates to a display device, a display module, an electronic device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a driving method thereof, and a manufacturing method thereof.

2. Description of the Related Art

Recent display devices have been expected to be applied to a variety of uses. Light-emitting devices including light-emitting elements, liquid crystal display devices including liquid crystal elements, and the like have been developed as display devices.

Patent Document 1, for example, discloses a flexible light-emitting device to which an organic electroluminescent (EL) element is applied.

Patent Document 2 discloses a transflective liquid crystal display device having a region reflecting visible light and a region transmitting visible light. The transflective liquid crystal display device can be used as a reflective liquid crystal display device in an environment where sufficient external light can be obtained and as a transmissive liquid crystal display device in an environment where sufficient external light cannot be obtained.

REFERENCE

Patent Documents

[Patent Document 1] Japanese Published Patent Application No. 2014-197522
[Patent Document 2] Japanese Published Patent Application No. 2011-191750

SUMMARY OF THE INVENTION

An object of one embodiment of the present invention is to provide a display device with low power consumption. Another object of one embodiment of the present invention is to provide a display device with high visibility regardless of the ambient brightness. Another object of one embodiment of the present invention is to provide an all-weather display device. Another object of one embodiment of the present invention is to provide a display device with high convenience. Another object of one embodiment of the present invention is to reduce the thickness or weight of a display device. Another object of one embodiment of the present invention is to provide a novel display device, a novel input/output device, a novel electronic device, or the like.

Note that the descriptions of these objects do not preclude the existence of other objects. One embodiment of the present invention does not necessarily achieve all the objects. Other objects can be derived from the description of the specification, the drawings, and the claims.

One embodiment of the present invention is a display device including a first display element, a second display element, a first transistor, and a second transistor. The first display element has a function of reflecting visible light. The second display element has a function of emitting visible light. The first transistor has a function of controlling the driving of the first display element. The second transistor has a function of controlling the driving of the second display element. The first transistor is positioned closer to a display surface side of the display device than the first display element is. The first display element is positioned closer to the display surface side than the second display element and the second transistor are. The first display element preferably includes a reflective layer that has a function of reflecting visible light. The reflective layer includes an opening. The second display element includes a portion overlapping with the opening. The second display element has a function of emitting visible light toward the opening.

The display device of one embodiment of the present invention is preferably configured to display an image using one or both of light reflected by the first display element and light emitted from the second display element.

The first display element is preferably a reflective liquid crystal element.

The second display element is preferably an electroluminescent element.

One or both of the first transistor and the second transistor preferably include an oxide semiconductor in a channel formation region.

The first display element preferably includes a first electrode, a liquid crystal layer, and a second electrode. The liquid crystal layer is positioned between the first electrode and the second electrode. The first electrode is positioned closer to the display surface side than the second electrode is. The first electrode is electrically connected to a source or a drain of the first transistor positioned closer to the display surface side than the first electrode is. The second electrode is electrically connected to a conductive layer positioned closer to the display surface side than the liquid crystal layer is. In this case, the display device preferably includes an insulating layer in contact with the second electrode. The second electrode is positioned closer to the display surface side than the insulating layer is. The second electrode is electrically isolated from each conductive layer that is positioned closer to a surface side facing the display surface than the insulating layer is.

The display device of one embodiment of the present invention preferably further includes an optical member. A shortest distance between the optical member and the second transistor is longer than a shortest distance between the optical member and the first transistor. A shortest distance between the optical member and the second display element is longer than a shortest distance between the optical member and the first display element. The first transistor is positioned between the optical member and the first display element. The first display element is positioned between the optical member and the second transistor. The first display element is positioned between the optical member and the second display element. The optical member preferably includes at least one of a polarizing plate, a light diffusion layer, and an anti-reflective layer.

One embodiment of the present invention is a display module including any of the above display devices and a circuit board such as a flexible printed circuit (FPC).

One embodiment of the present invention is an electronic device including the above display module and at least one of an antenna, a battery, a housing, a camera, a speaker, a microphone, and an operation button.

One embodiment of the present invention is a method for manufacturing a display device including a first display element, a second display element, a first transistor having a function of controlling the driving of the first display element, and a second transistor having a function of controlling the driving of the second display element. Specifically, the first transistor and a first electrode electrically connected to a source or a drain of the first transistor are formed over a first substrate. In a step performed independently of the step performed over the first substrate, a separation layer is formed over a formation substrate, a second electrode is formed over the separation layer, a second insulating layer is formed over the second electrode, and the second transistor and the second display element are formed over the second insulating layer. Then, the formation substrate and a second substrate are bonded to each other with an adhesive. Next, the formation substrate and the second electrode are separated from each other. The first substrate and the second substrate are bonded to each other with an adhesive so that a liquid crystal layer is positioned between the first electrode and the exposed second electrode, whereby the first display element is formed. It is preferable that the second electrode have a function of reflecting visible light and that an opening be formed in the second electrode. The second display element is preferably formed in a position overlapping with the opening.

The adhesive used to bond the first substrate and the second substrate to each other preferably includes a conductive particle. The second electrode is preferably electrically connected to a conductive layer through the conductive particle when the first substrate and the second substrate are bonded to each other. The conductive layer and the first electrode are formed by processing one conductive film.

According to one embodiment of the present invention, a display device with low power consumption can be provided. According to one embodiment of the present invention, a display device with high visibility regardless of the ambient brightness can be provided. According to one embodiment of the present invention, an all-weather display device can be provided. According to one embodiment of the present invention, a display device with high convenience can be provided. According to one embodiment of the present invention, the thickness or weight of a display device can be reduced. According to one embodiment of the present invention, a novel display device, a novel input/output device, a novel electronic device, or the like can be provided.

Note that the descriptions of these effects do not preclude the existence of other effects. One embodiment of the present invention does not necessarily have all the effects. Other effects can be derived from the description of the specification, the drawings, and the claims.

DETAILED DESCRIPTION OF THE INVENTION

Figure 1:
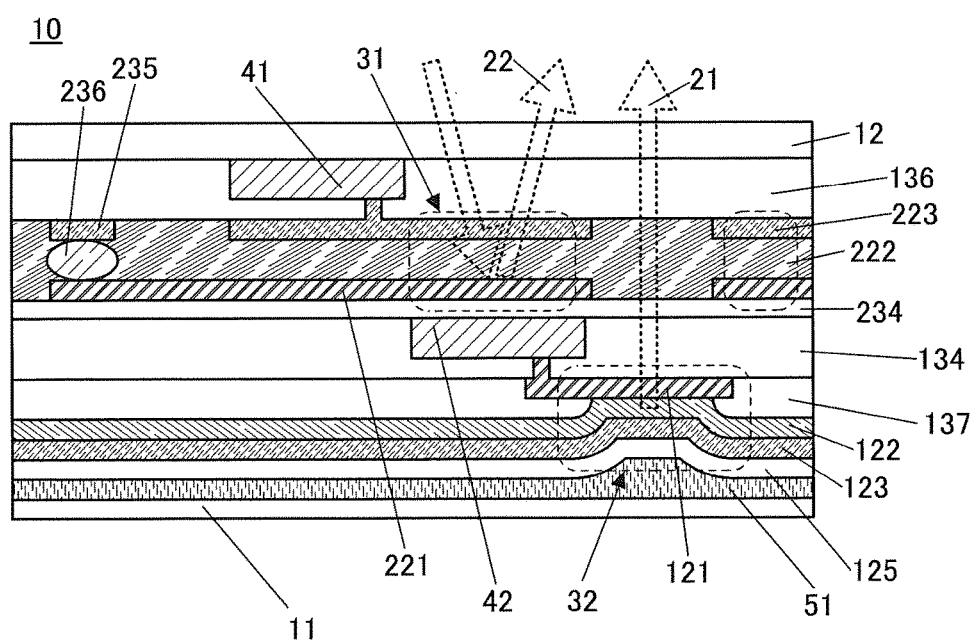
FIG. 1 is a cross-sectional view illustrating an example of a display device.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film," and the term "insulating film" can be changed into the term "insulating layer."

(Embodiment 1)

In this embodiment, a display device of one embodiment of the present invention will be described with reference to FIG. 1, FIG. 2, FIGS. 3A to 3C, FIGS. 4A to 4C, FIGS. 5A to 5C, FIG. 6, FIG. 7, FIGS. 8A and 8B, FIGS. 9A and 9B, FIGS. 10A to 10C, FIGS. 11A to 11C, FIGS. 12A to 12C, FIGS. 13A and 13B, and FIGS. 14A and 14B.

The display device of this embodiment includes a first display element, a second display element, a first transistor, and a second transistor. The first display element has a function of reflecting visible light. The second display element has a function of emitting visible light. The first transistor has a function of controlling the driving of the first display element. The second transistor has a function of controlling the driving of the second display element. The first transistor is positioned closer to a display surface side of the display device than the first display element is. The first display element is positioned closer to the display surface side than the second display element and the second transistor are.

The display device of one embodiment of the present invention has a function of displaying an image using one or both of light reflected by the first display element and light emitted from the second display element.

Specifically, the display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening. With the use of the combination of reflected light and emitted light, an image that makes a viewer feel like looking at a painting can be displayed.

With such a structure, an all-weather display device or a highly convenient display device with high visibility regardless of the ambient brightness can be fabricated.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than Micro Electro Mechanical Systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

FIG. 1 is a cross-sectional view of a display device 10. The display device 10 includes a liquid crystal element 31 as the first display element and a light-emitting element 32 as the second display element.

The display device 10 illustrated in FIG. 1 includes the liquid crystal element 31, the light-emitting element 32, a transistor 41, a transistor 42, and the like between a pair of substrates (a substrate 11 and a substrate 12).

The transistor 41 is positioned closer to a display surface side (the substrate 12 side) of the display device 10 than the liquid crystal element 31 is. The liquid crystal element 31 is positioned closer to the display surface side (the substrate 12 side) of the display device 10 than the light-emitting element 32 and the transistor 42 are.

The liquid crystal element 31 includes an electrode 221 having a function of reflecting visible light, a liquid crystal layer 222, and an electrode 223 having a function of transmitting visible light. The liquid crystal layer 222 is positioned between the electrode 221 and the electrode 223.

The liquid crystal element 31 has a function of reflecting visible light. The liquid crystal element 31 reflects light (reflected light 22) to the substrate 12 side.

The electrode 223 is electrically connected to a source or a drain of the transistor 41 through an opening provided in an insulating layer 136. That is, the electrode 223 functions as a pixel electrode. The electrode 221 is electrically connected to a conductive layer 235 through a conductive particle 236. The electrode 223 and the conductive layer 235 can be obtained by processing the same conductive film. An insulating layer 234 is provided between the electrode 221 and the transistor 42 and between the electrode 221 and the light-emitting element 32. In other words, the electrode 221 and an electrode included in the transistor 42 are electrically isolated from each other by the insulating layer 234. Similarly, the electrode 221 and an electrode included in the light-emitting element 32 are electrically isolated from each other by the insulating layer 234.

The light-emitting element 32 includes an electrode 121, an EL layer 122, and an electrode 123. The EL layer 122 is positioned between the electrode 121 and the electrode 123. The EL layer 122 contains at least a light-emitting substance. The electrode 121 has a function of transmitting visible light. The electrode 123 preferably has a function of reflecting visible light.

The light-emitting element 32 has a function of emitting visible light. Specifically, the light-emitting element 32 is an electroluminescent element that emits light to the substrate 12 side (light emission 21) when voltage is applied between the electrode 121 and the electrode 123.

The electrode 121 is electrically connected to a source or a drain of the transistor 42 through an opening provided in an insulating layer 134. An end portion of the electrode 121 is covered with an insulating layer 137.

The light-emitting element 32 is preferably covered with an insulating layer 125. In FIG. 1, the insulating layer 125 is provided in contact with the electrode 123. The insulating layer 125 can prevent an impurity from entering the light-emitting element 32, leading to an increase in the reliability of the light-emitting element 32. The insulating layer 125 and the substrate 11 are bonded to each other with an adhesive layer 51.

In the case where a transistor including an oxide semiconductor in its channel formation region and having extremely low off-state current is used as the transistor 41 or in the case where a memory element electrically connected to the transistor 41 is used, for example, in displaying a still image using the liquid crystal element 31, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

In the display device of this embodiment, the transistor for driving the first display element and the transistor for driving the second display element are formed over different substrates; thus, each of the transistors can be easily formed using a structure and a material suitable for driving the corresponding display element.

Figure 2:
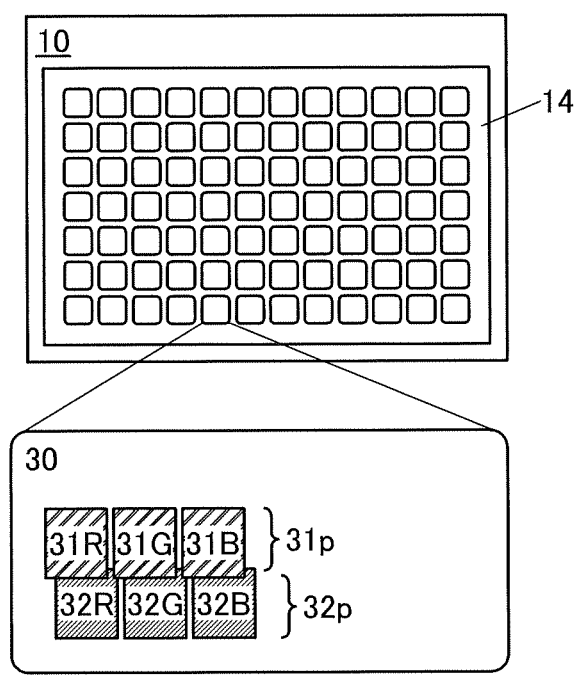
FIG. 2 is a block diagram illustrating an example of a display device.

FIG. 2 is a block diagram of a display device 10. The display device 10 includes a display portion 14.

The display portion 14 includes a plurality of pixel units 30 arranged in a matrix. The pixel units 30 each include a first pixel 31p and a second pixel 32p.

FIG. 2 shows an example where the first pixel 31p and the second pixel 32p each include display elements corresponding to three colors of red (R), green (G), and blue (B).

The display elements included in the first pixel 31p are each a display element that utilizes reflection of external light. The first pixel 31p includes a first display element 31R corresponding to red (R), a first display element 31G corresponding to green (G), and a first display element 31B corresponding to blue (B).

The display elements included in the second pixel 32p are each a light-emitting element. The second pixel 32p includes a second display element 32R corresponding to red (R), a second display element 32G corresponding to green (G), and a second display element 32B corresponding to blue (B).

Figure 3A:
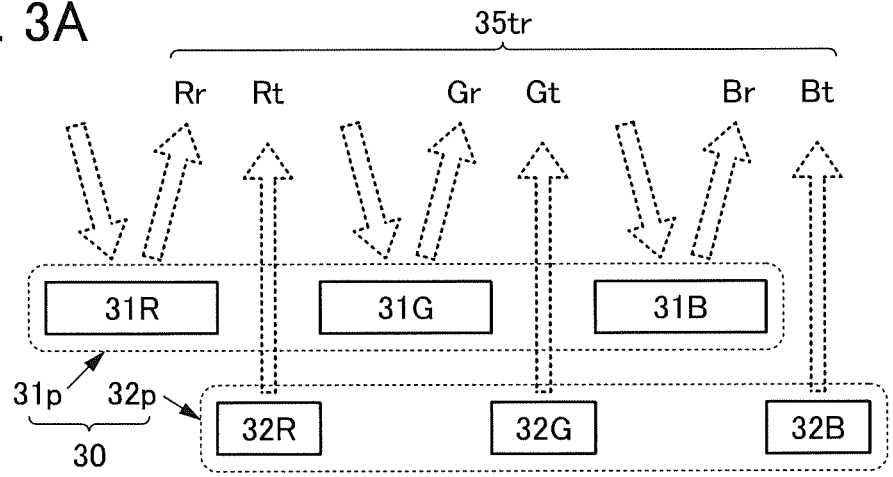
FIGS. 3A to 3C each illustrate an example of a pixel unit.
Figure 3B:
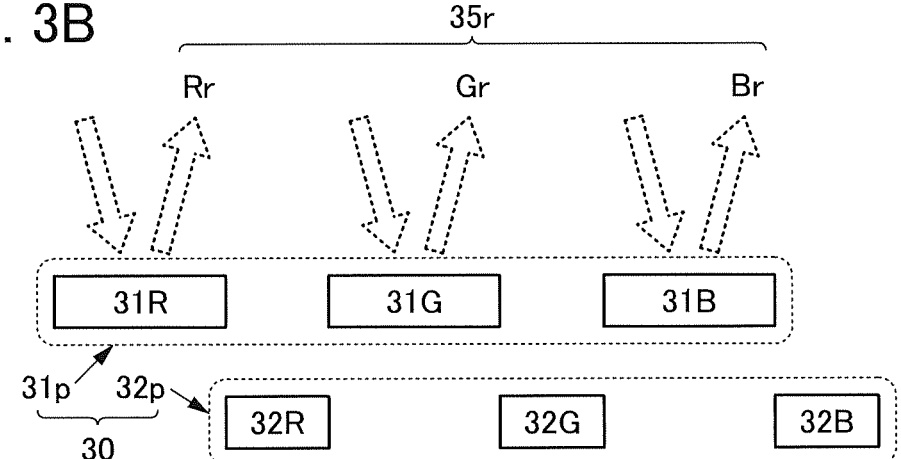
Figure 3C:
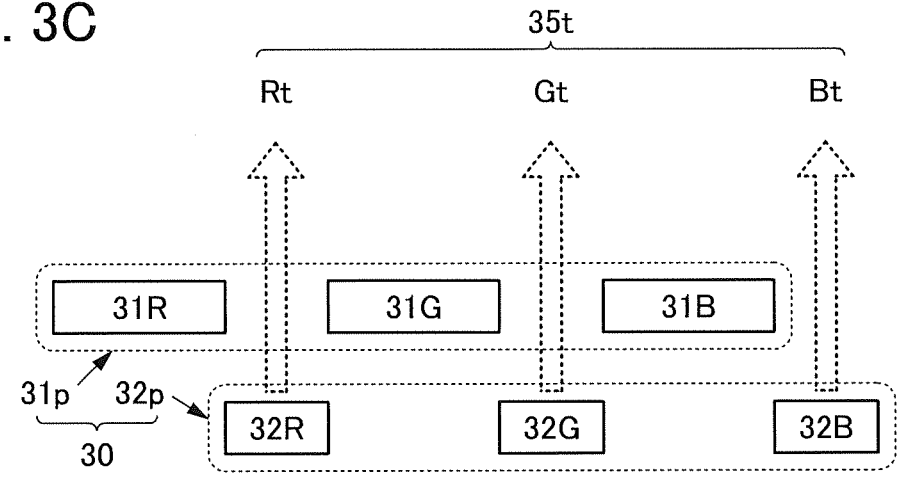

FIGS. 3A to 3C are schematic views illustrating a structure example of the pixel unit 30.

The first pixel 31p includes the first display element 31R, the first display element 31G, and the first display element 31B. The first display element 31R reflects external light and emits red light Rr to the display surface side. Similarly, the first display element 31G and the first display element 31B emit green light Gr and blue light Br, respectively, to the display surface side.

The second pixel 32p includes the second display element 32R, the second display element 32G, and the second display element 32B. The second display element 32R emits red light Rt to the display surface side. Similarly, the second display element 32G and the second display element 32B emit green light Gt and blue light Bt, respectively, to the display surface side.

FIG. 3A corresponds to a display mode (third mode) in which both the first pixel 31p and the second pixel 32p are driven. The pixel unit 30 can emit light 35tr of a predetermined color to the display surface side using the reflected light (the light Rr, the light Gr, and the light Br) and the transmitted light (the light Rt, the light Gt, and the light Bt).

FIG. 3B corresponds to a display mode (first mode) using reflected light in which only the first pixel 31p is driven. For example, when the intensity of external light is high enough, the pixel unit 30 can emit light 35r to the display surface side using only the light from the first pixel 31p (the light Rr, the light Gr, and the light Br), without driving the second pixel 32p. Thus, driving with extremely low power consumption can be performed.

FIG. 3C corresponds to a display mode (second mode) using generated light (transmitted light) in which only the second pixel 32p is driven. For example, when the intensity of external light is extremely low, the pixel unit 30 can emit light 35t to the display surface side using only the light from the second pixel 32p (the light Rt, the light Gt, and the light Bt), without driving the first pixel 31p. Thus, a vivid image can be displayed. Furthermore, by lowering the luminance in a dark environment, a user can be prevented from feeling glare and power consumption can be reduced.

The color and number of display elements included in the first pixel 31p and the second pixel 32p are not limited.

FIGS. 4A to 4C and FIGS. 5A to 5C each illustrate a structure example of the pixel unit 30. Although FIGS. 4A to 4C and FIGS. 5A to 5C are schematic views corresponding to the display mode (third mode) in which both the first pixel 31p and the second pixel 32p are driven, display can also be performed in the mode (first mode or second mode) in which only the first pixel 31p or the second pixel 32p is driven, like the above-described structure example.

Figure 4A:
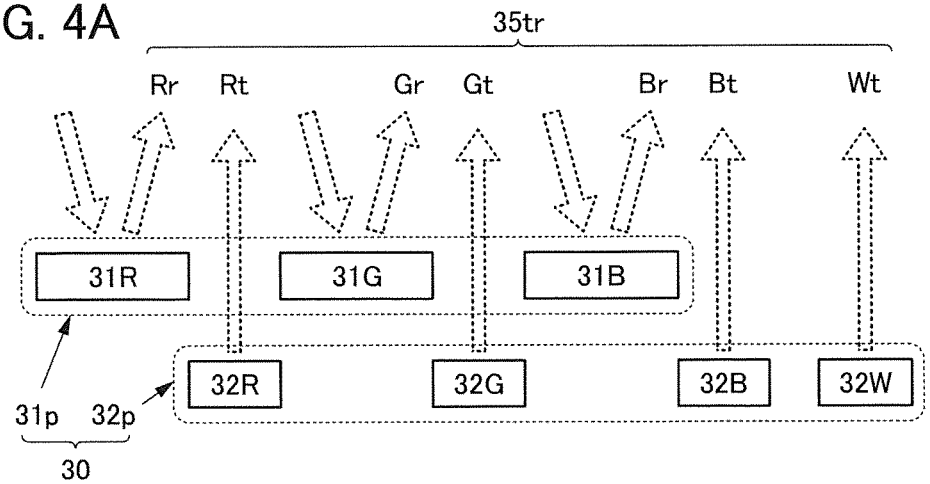
FIGS. 4A to 4C each illustrate an example of a pixel unit.
Figure 4B:
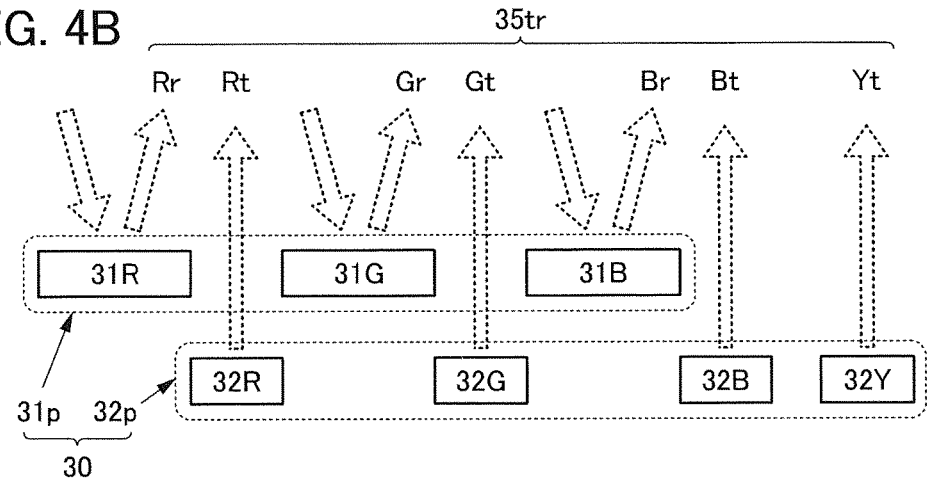
Figure 4C:
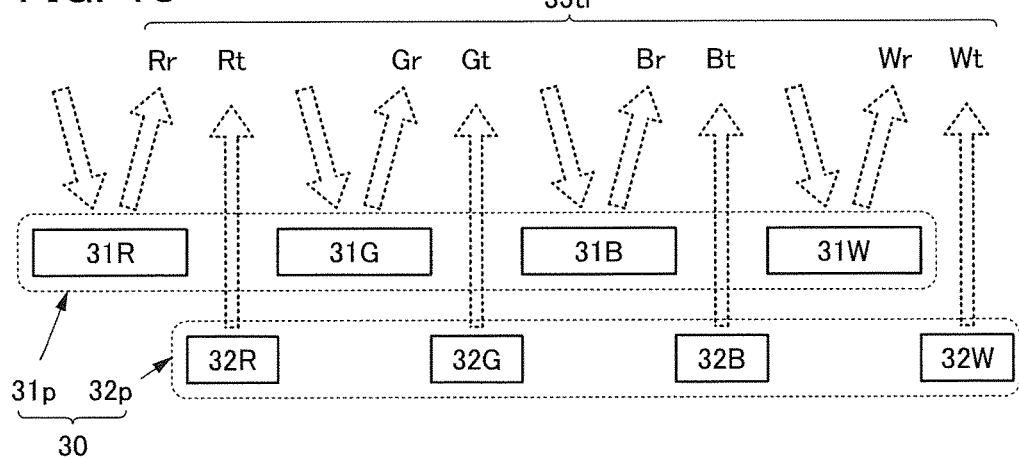
Figure 5A:
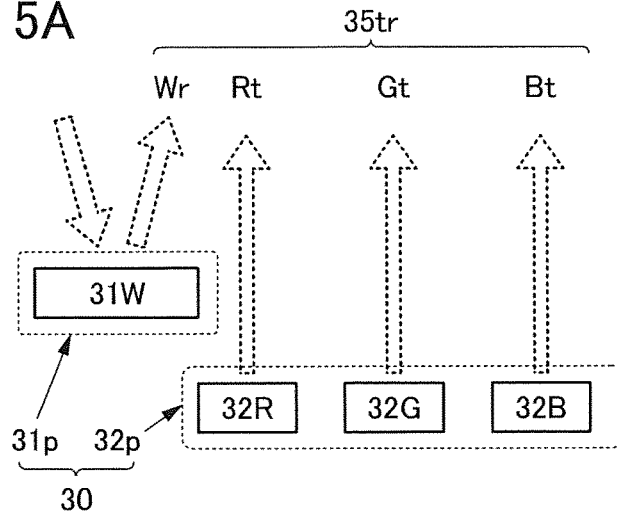
FIGS. 5A to 5C each illustrate an example of a pixel unit.
Figure 5B:
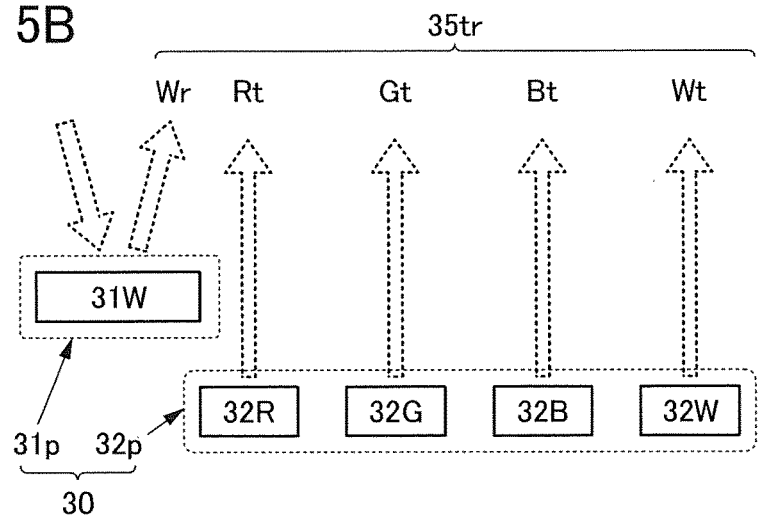

The second pixel 32p illustrated in FIGS. 4A and 4C and FIG. 5B includes a second display element 32W emitting white (W) light in addition to the second display element 32R, the second display element 32G, and the second display element 32B.

Figure 5C:
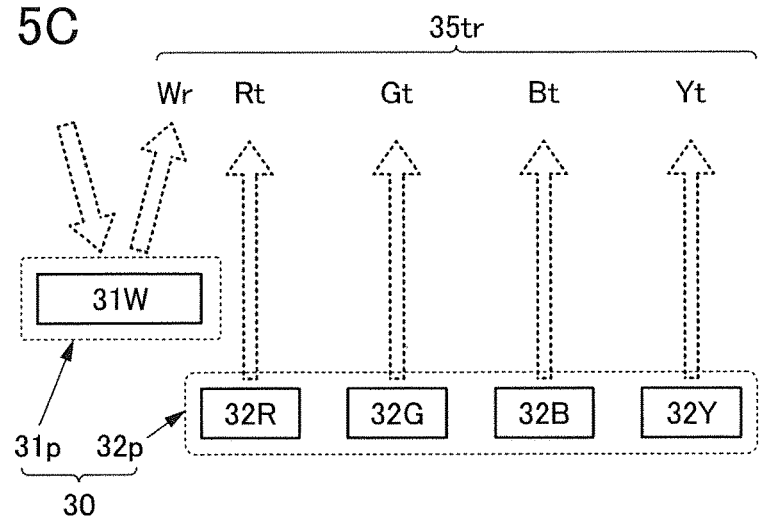

The second pixel 32p illustrated in FIG. 4B and FIG. 5C includes a second display element 32Y emitting yellow (Y) light in addition to the second display element 32R, the second display element 32G, and the second display element 32B.

Power consumption in the display mode using the second pixel 32p (second mode and third mode) can be lower in the structures illustrated in FIGS. 4A to 4C and FIGS. 5B and 5C than in the structure not including the second display element 32W or the second display element 32Y.

The first pixel 31p illustrated in FIG. 4C includes a first display element 31W emitting white (W) light in addition to the first display element 31R, the first display element 31G, and the first display element 31B.

Power consumption in the display mode using the first pixel 31p (first mode and third mode) can be lower in the structure illustrated in FIG. 4C than in the structure illustrated in FIG. 3A.

The first pixel 31p illustrated in FIGS. 5A to 5C includes only the first display element 31W emitting white (W) light. In this structure, a black-and-white image or a grayscale image can be displayed in the display mode (first mode) using only the first pixel 31p, and a color image can be displayed in the display mode (second mode and third mode) using the second pixel 32p.

This structure can increase the aperture ratio of the first pixel 31p and thus increase the reflectivity of the first pixel 31p: accordingly, a brighter image can be displayed.

The first mode is suitable for displaying data that need not be displayed in color such as text data.

Next, structure examples of the display device of this embodiment will be described with reference to FIG. 6, FIG. 7, FIGS. 8A and 8B, and FIGS. 9A and 9B.

<Structure Example 1>

Figure 6:
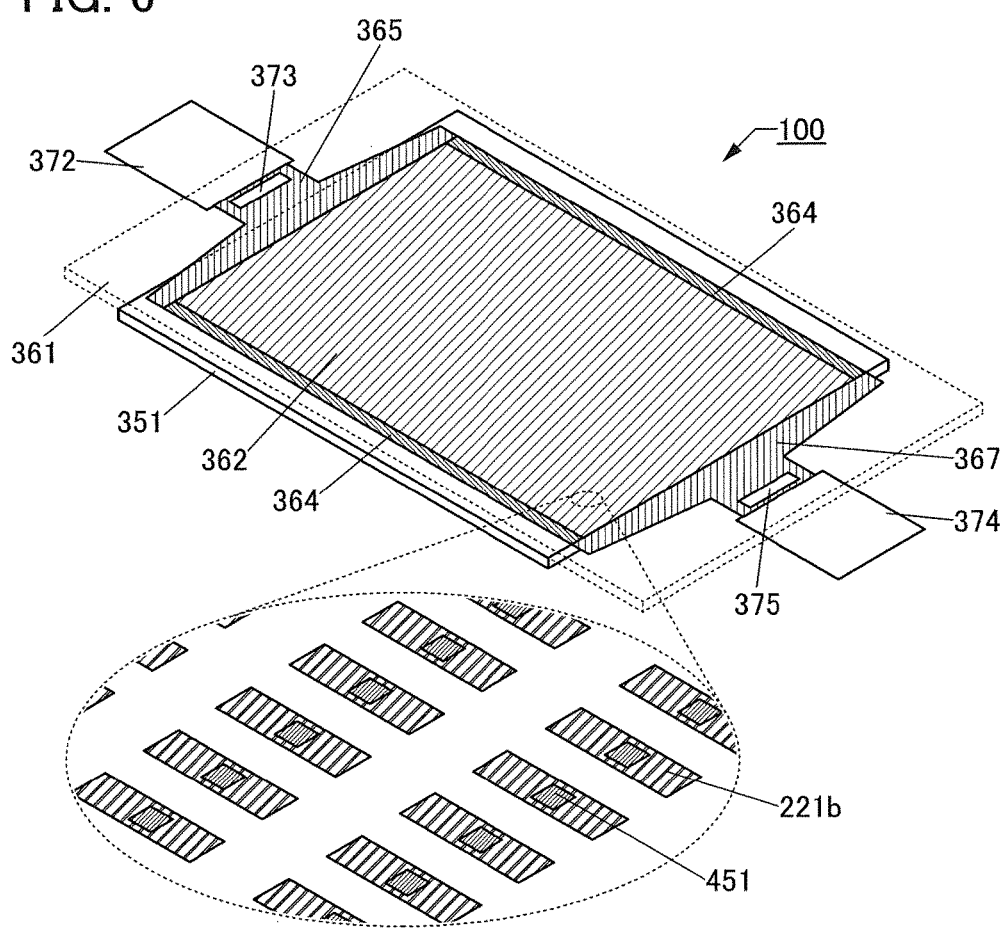
FIG. 6 is a perspective view illustrating an example of a display device.

FIG. 6 is a schematic perspective view of a display device 100. In the display device 100, a substrate 351 and a substrate 361 are bonded to each other. In FIG. 6, the substrate 361 is denoted by a dashed line.

The display device 100 includes a display portion 362, a circuit 364, a wiring 365, a wiring 367, and the like. FIG. 6 illustrates an example in which the display device 100 is provided with an integrated circuit (IC) 373, an FPC 372, an IC 375, and an FPC 374. Thus, the structure illustrated in FIG. 6 can be regarded as a display module including the display device 100, the ICs, and the FPCs.

As the circuit 364, for example, a scan line driver circuit can be used.

The wiring 365 has a function of supplying a signal and electric power to the display portion 362 and the circuit 364. The signal and the electric power is input to the wiring 365 from the outside through the FPC 372 or from the IC 373. The wiring 367 has a function of supplying a signal and electric power to the display portion 362 and the circuit 364. The signal and the electric power are input to the wiring 367 from the outside through the FPC 374 or from the IC 375.

An IC including a scan line driver circuit, a signal line driver circuit, or the like can be used as the IC 373 and the IC 375, for example. Note that the display device 100 and the display module are not necessarily provided with an IC. The IC may be provided over the FPC by a chip on film (COF) method or the like.

FIG. 6 illustrates an enlarged view of part of the display portion 362. Electrodes 221b included in a plurality of display elements are arranged in a matrix in the display portion 362. The electrode 221b has a function of reflecting visible light, and serves as a reflective electrode of the liquid crystal element 31.

As illustrated in FIG. 6, the electrode 221b includes an opening 451. In addition, the display portion 362 includes the light-emitting element 32 that is positioned closer to the substrate 351 than the electrode 221b is. Light from the light-emitting element 32 is emitted to the substrate 361 side through the opening 451 in the electrode 221b.

Figure 7:
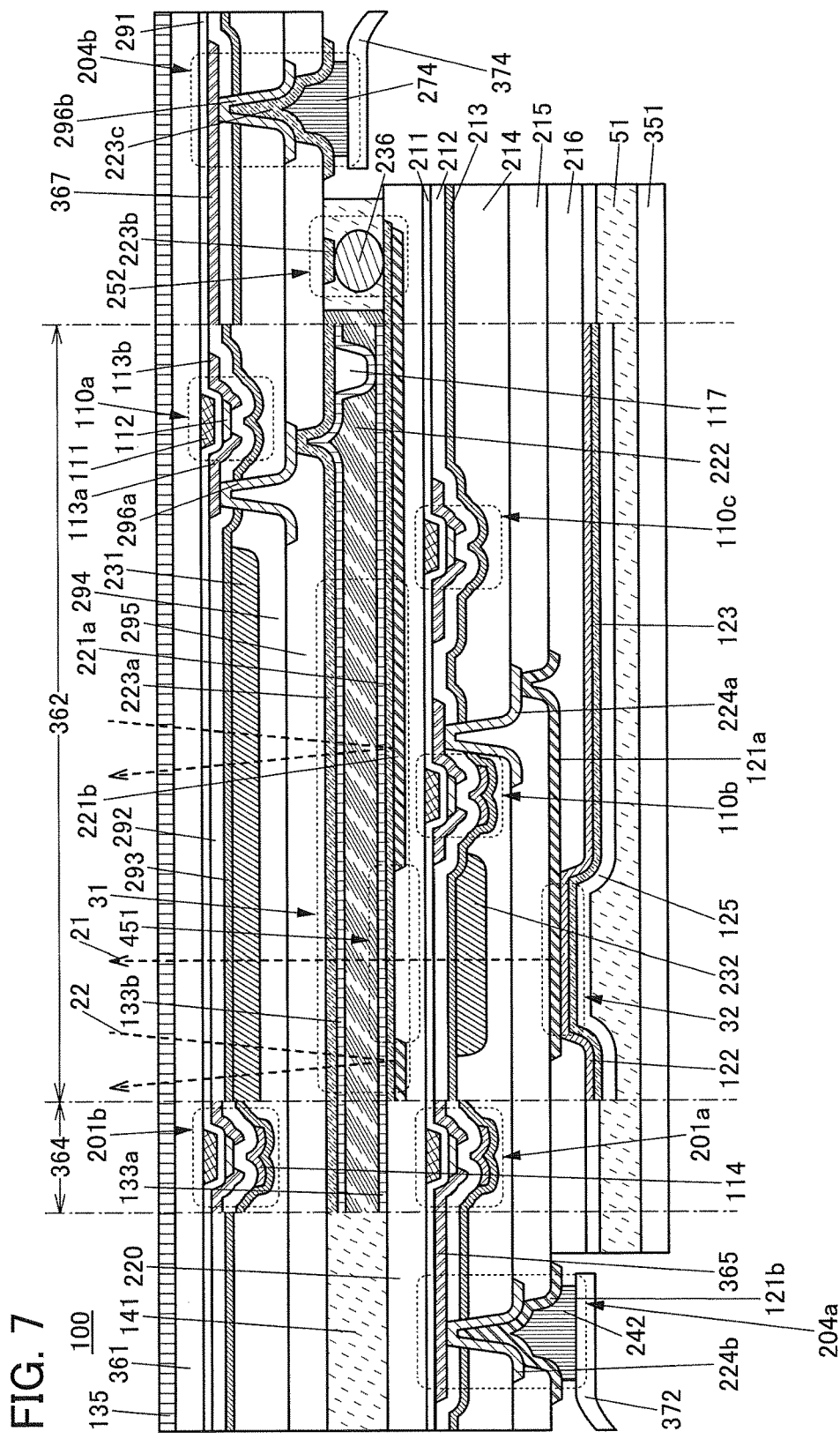
FIG. 7 is a cross-sectional view illustrating an example of a display device.

FIG. 7 illustrates an example of cross sections of part of a region including the FPC 372, part of a region including the FPC 374, part of a region including the circuit 364, and part of a region including the display portion 362 of the display device 100 illustrated in FIG. 6.

The display device 100 illustrated in FIG. 7 includes, between the substrate 351 and the substrate 361, a transistor 201a, a transistor 201b, the liquid crystal element 31, the light-emitting element 32, a transistor 110a, a transistor 110b, a transistor 110c, an insulating layer 220, a coloring layer 231, a coloring layer 232, and the like. The substrate 361 and the insulating layer 220 are bonded to each other with an adhesive layer 141. The substrate 351 and the insulating layer 220 are bonded to each other with the adhesive layer 51.

The transistor 110a and the transistor 201b are provided on the substrate 351 side of the substrate 361.

There is no limitation of the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

The transistor 110a includes a conductive layer 111 functioning as a gate, an insulating layer 291 functioning as a gate insulating layer, a semiconductor layer 112, and a conductive layer 113a and a conductive layer 113b functioning as a source and a drain.

The transistor 201b includes a conductive layer 114 functioning as a gate, in addition to the components of the transistor 110a.

The structure in which the semiconductor layer where a channel is formed is provided between two gates is used as an example of the transistor 201b. Such a structure enables the control of the threshold voltage of transistor. The two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display device in which the number of wirings is increased because of increase in size or definition.

Alternatively, by supplying a potential for controlling the threshold voltage to one of the two gates and a potential for driving to the other, the threshold voltage of the transistor can be controlled.

The semiconductor layer 112, the conductive layer 113a, and the conductive layer 113b are covered with an insulating layer 292. The conductive layer 114 is provided in contact with the insulating layer 292. An insulating layer 293 is provided in contact with the insulating layer 292 and the conductive layer 114.

It is preferable to use a conductive material containing an oxide for the conductive layer 114. A conductive film used for the conductive layer 114 is formed under an atmosphere containing oxygen, whereby oxygen can be supplied to the insulating layer 292. The proportion of an oxygen gas in a deposition gas is preferably higher than or equal to 90% and lower than or equal to 100%. Oxygen supplied to the insulating layer 292 is then supplied to the semiconductor layer 112 by later heat treatment; as a result, oxygen vacancies in the semiconductor layer 112 can be reduced.

It is particularly preferable to use a low-resistance oxide semiconductor for the conductive layer 114. In that case, an insulating film that releases hydrogen, such as a silicon nitride film, is preferably used for the insulating layer 293, for example, because hydrogen can be supplied to the conductive layer 114 during the formation of the insulating layer 293 or by heat treatment performed after the formation of the insulating layer 293, which leads to an effective reduction in the electric resistance of the conductive layer 114.

The coloring layer 231 is provided in contact with the insulating layer 293. The coloring layer 231 is covered with the insulating layer 294.

A conductive layer 296a is connected to the conductive layer 113a included in the transistor 110a through an opening provided in the insulating layer 292, the insulating layer 293, and the insulating layer 294. The conductive layer 296a is covered with an insulating layer 295. An electrode 223a is connected to the conductive layer 296a through an opening provided in the insulating layer 295. In this manner, the electrode 223a functioning as a pixel electrode of the liquid crystal element 31 and the conductive layer 113a functioning as a source or a drain of the transistor 110a are electrically connected to each other.

The insulating layer 294 and the insulating layer 295 each function as a planarization layer. The insulating layer 295 enables the electrode 223a to have an almost flat surface, which results in a uniform alignment state of the liquid crystal layer 222. The insulating layer 294 and the conductive layer 296a are not necessarily provided. That is, the electrode 223a and the conductive layer 113a may be directly connected to each other.

An insulating layer 117 is provided in contact with the electrode 223a. The electrode 223a and the insulating layer 117 are covered with an alignment film 133b. The insulating layer 117 functions as a spacer for holding a cell gap of the liquid crystal element 31.

The liquid crystal element 31 is a reflective liquid crystal element. The liquid crystal element 31 has a stacked-layer structure of an electrode 221a, the liquid crystal layer 222, and the electrode 223a. The electrode 221b that reflects visible light is provided in contact with a surface of the electrode 221a on the substrate 351 side. The electrode 221b includes the opening 451. The electrode 221a and the electrode 223a transmit visible light. An alignment film 133a is provided between the liquid crystal layer 222 and the electrode 221a. The alignment film 133b is provided between the liquid crystal layer 222 and the electrode 223a. A polarizing plate 135 is provided on an outer surface of the substrate 361.

As illustrated in FIG. 7, the electrode 221a that transmits visible light is preferably provided across the opening 451. Accordingly, liquid crystals in the liquid crystal layer 222 are aligned in a region overlapping with the opening 451 as in the other regions, in which case an alignment defect of the liquid crystals is prevented from being generated in a boundary portion of these regions and undesired light leakage can be suppressed.

The electrode 221a functions as a common electrode of the liquid crystal element 31. A connection portion 252 is provided in part of a region where the adhesive layer 141 is provided. In the connection portion 252, a conductive layer 223b obtained by processing the same conductive film as the electrode 223a and part of the electrode 221a are electrically connected to each other through the conductive particle 236. Thus, a potential can be supplied from the FPC 374 to the electrode 221a. Note that the electrode 221a and the electrode 221b can be regarded as functioning as common electrodes of the liquid crystal element 31.

As the conductive particle 236, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the conductive particle 236, a material capable of elastic deformation or plastic deformation is preferably used. As illustrated in FIG. 7, the conductive particle 236 has a shape that is vertically crushed in some cases. In this manner, the contact area between the conductive particle 236 and the electrode 221a and the contact area between the conductive particle 236 and the conductive layer 223b are increased, whereby the contact resistance can be reduced and the generation of defects such as disconnection can be suppressed.

The conductive particle 236 is preferably provided so as to be covered with the adhesive layer 141. For example, the conductive particle 236 is dispersed in the adhesive layer 141 before curing of the adhesive layer 141.

In the liquid crystal element 31, the electrode 221b has a function of reflecting visible light, and the electrode 223a has a function of transmitting visible light. Light entering from the substrate 361 side is polarized by the polarizing plate 135, transmitted through the electrode 223a and the liquid crystal layer 222, and reflected by the electrode 221b. Then, the light is transmitted through the liquid crystal layer 222 and the electrode 223a again to reach the polarizing plate 135 (reflected light 22). In this case, alignment of a liquid crystal can be controlled with a voltage that is applied between the electrode 221b and the electrode 223a, and thus optical modulation of light can be controlled. In other words, the intensity of light emitted through the polarizing plate 135 can be controlled. Light excluding light in a particular wavelength region is absorbed by the coloring layer 231, and thus, emitted light is red light, for example.

As the polarizing plate 135 provided on an outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The display device 100 of this embodiment includes a plurality of transistors, such as the transistor 110a, on the display surface side. With a circularly polarizing plate, reflection of external light by the wirings, the electrodes of the transistors, and the like can be suppressed. The cell gap, alignment, drive voltage, and the like of the liquid crystal element used as the liquid crystal element 31 are controlled depending on the kind of the polarizing plate, so that desirable contrast can be obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

The transistor 201a, the transistor 110b, and the transistor 110c are provided on the substrate 351 side of the insulating layer 220. The transistors 110b and 201a each have the same structure as the transistor 201b. The transistor 110c has the same structure as the transistor 110a.

Part of an insulating layer 211 functions as a gate insulating layer of each transistor. An insulating layer 212 covers the transistor 110c. The transistor 110b and the transistor 201a each include one of a pair of gates between the insulating layer 212 and an insulating layer 213. An insulating layer 214 covers each transistor. An insulating layer 215 is provided to cover the insulating layer 214. The insulating layers 214 and 215 each function as a planarization layer. The number of the insulating layers covering the transistors and the like is not particularly limited.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be achieved.

A conductive layer 224a is connected to a source or a drain of the transistor 110b through an opening provided in the insulating layer 212, the insulating layer 213, and the insulating layer 214. An electrode 121a is connected to the conductive layer 224a through an opening provided in the insulating layer 215. In this manner, the electrode 121a functioning as a pixel electrode of the light-emitting element 32 and the source or the drain of the transistor 110b are electrically connected to each other. The insulating layer 214 and the conductive layer 224a are not necessarily provided. That is, the electrode 121a and the source or the drain of the transistor 110b may be directly connected to each other.

The light-emitting element 32 is a bottom-emission light-emitting element. The light-emitting element 32 has a stacked-layer structure in which the electrode 121a, the EL layer 122, and the electrode 123 are stacked in this order from the insulating layer 220 side. The insulating layer 216 covers an end portion of the electrode 121a. The electrode 123 includes a material that reflects visible light, and the electrode 121a includes a material that transmits visible light. The insulating layer 125 is provided to cover the electrode 123. Light is emitted from the light-emitting element 32 to the substrate 361 side through the coloring layer 232, the insulating layer 220, the opening 451, the electrode 221a, and the like.

The liquid crystal element 31 and the light-emitting element 32 can exhibit various colors when the color of the coloring layer varies among pixels. The display device 100 can display a color image using the liquid crystal element 31. The display device 100 can display a color image using the light-emitting element 32.

A connection portion 204a and a connection portion 204b are each provided in a region where the substrates 361 and 351 do not overlap with each other.

In the connection portion 204a, the wiring 365 is electrically connected to the FPC 372 through a conductive layer 224b, a conductive layer 121b, and a connection layer 242. The electrode 121a and the conductive layer 121b can be obtained by processing the same conductive film. The conductive layer 224a and the conductive layer 224b can be obtained by processing the same conductive film. The conductive layer 121b is electrically connected to the FPC 372 through the connection layer 242.

Similarly, in the connection portion 204b, the wiring 367 is electrically connected to the FPC 374 through a conductive layer 296b, a conductive layer 223c, and a connection layer 274. The conductive layer 296a and the conductive layer 296b can be obtained by processing the same conductive film. The electrode 223a, the conductive layer 223b, and the conductive layer 223c can be obtained by processing the same conductive film. The conductive layer 223c is electrically connected to the FPC 374 through the connection layer 274.

For each of the substrates 351 and 361, glass, quartz, ceramic, sapphire, an organic resin, or the like can be used. When the substrates 351 and 361 are limited using a flexible material, the flexibility of the display device can be increased.

A liquid crystal element having, for example, a vertical alignment (VA) mode can be used as the liquid crystal element 31. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 31. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

As the adhesive layer, any of a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

As each of the connection layer 242 and the connection layer 274, an anisotropic conductive film (ACF), an anisotropic conductive paste (ACP), or the like can be used.

The light-emitting element 32 may be a top emission, bottom emission, or dual emission light-emitting element, or the like. A conductive film that transmits visible light is used as the electrode through which light is extracted. A conductive film that reflects visible light is preferably used as the electrode through which light is not extracted.

The EL layer 122 includes at least a light-emitting layer. In addition to the light-emitting layer, the EL layer 122 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 122, and an inorganic compound may also be included. The layers included in the EL layer 122 can be formed by any of the following methods: an evaporation method (including a vacuum evaporation method), a transfer method, a printing method, an inkjet method, a coating method, and the like.

The EL layer 122 may contain an inorganic compound such as quantum dots. When quantum dots are used for the light-emitting layer, quantum dots can function as light-emitting materials, for example.

With the use of the combination of a color filter (coloring layer) and a microcavity structure (optical adjustment layer), light with high color purity can be extracted from the display device. The thickness of the optical adjustment layer varies depending on the color of the pixel.

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is preferably set small enough to be able to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

Examples of an insulating material that can be used for the insulating layers include a resin such as acrylic or epoxy resin, and an inorganic insulating material such as silicon oxide, silicon oxynitride, silicon nitride oxide, silicon nitride, or aluminum oxide.

Examples of a material that can be used for the coloring layers include a metal material, a resin material, and a resin material containing a pigment or dye.

<Structure Example 2>

Figure 8A:
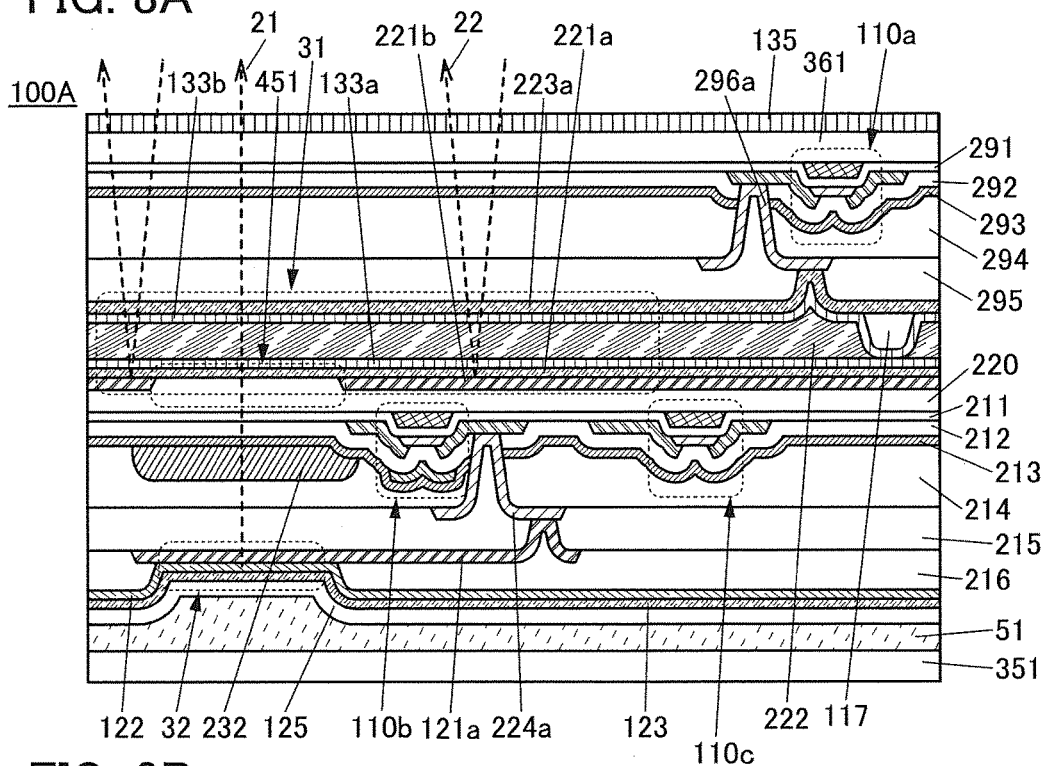
FIGS. 8A and 8B are cross-sectional views each illustrating an example of a display device.

FIG. 8A is a cross-sectional view illustrating a display portion of a display device 100A.

The display device 100A is different from the display device 100 in that the coloring layer 231 is not provided. Other components are similar to those of the display device 100 and thus are not described in detail.

The liquid crystal element 31 emits white light. Since the coloring layer 231 is not provided, the display device 100A can display a black-and-white image or a grayscale image using the liquid crystal element 31.

<Structure Example 3>

Figure 8B:
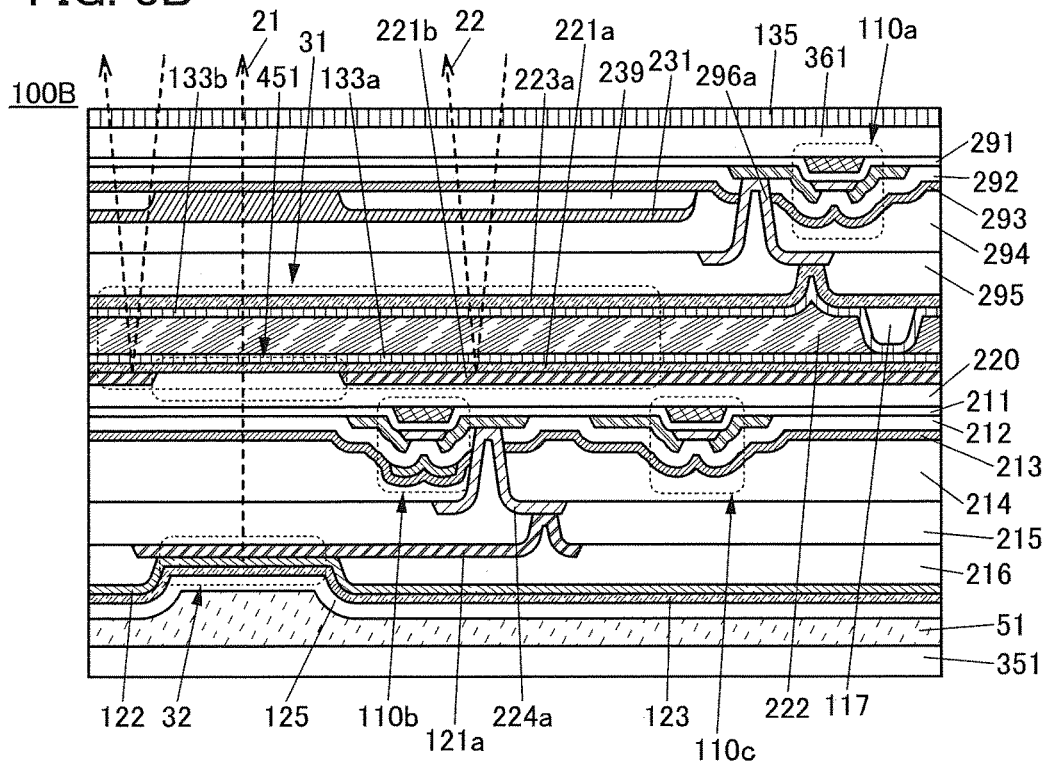

FIG. 8B is a cross-sectional view illustrating a display portion of a display device 100B.

The display device 100B is different from the display device 100 in that an insulating layer 239 is included and the coloring layer 232 is not included. Other structures are the same as those of the display device 100 and thus are not described in detail.

The insulating layer 239 is provided between the insulating layer 293 and the coloring layer 231. The insulating layer 239 is provided to overlap with a display region (hereinafter referred to as a reflective region) of the liquid crystal element 31, and not to overlap with a light-emitting region (hereinafter referred to as a transmissive region) of the light-emitting element 32. Consequently, the thickness of the coloring layer 231 in the reflective region is different from that in the transmissive region.

In the reflective region, light passes through the coloring layer 231 twice (see reflected light 22). In contrast, in the transmissive region, light passes through the coloring layer 231 only once (see emitted light 21). In the case where the thickness of the coloring layer 231 in the reflective region is the same as that in the transmissive region, there is a possibility that the color tone of display varies.

The thickness of the coloring layer 231 in the reflective region and that in the transmissive region can be made different by providing the insulating layer 239. Thus, display with excellent color tone can be performed in display using the liquid crystal element 31 and display using the light-emitting element 32.

The thickness of the coloring layer 231 in the reflective region is preferably greater than or equal to 40% and less than or equal to 60% of the thickness of the coloring layer 231 in the transmissive region.

The method for making the coloring layer 231 have different thicknesses is not limited to the method in which the insulating layer 239 is provided in a part. For example, the coloring layer 231 may have a stacked-layer structure including two or more layers. In this case, the coloring layer 231 in the transmissive region includes more layers than the coloring layer 231 in the reflective region. Alternatively, a coloring layer including two regions having different thicknesses may be formed with the use of a multi-tone mask.

As illustrated in FIG. 7, a plurality of coloring layers (the coloring layer 231 and the coloring layer 232) may be provided. The emitted light 21 passes through both the coloring layer 231 and the coloring layer 232. The reflected light 22 passes through only the coloring layer 231. Even with such a structure, display with excellent color tone can be performed in display using the liquid crystal element 31 and display using the light-emitting element 32.

Either an organic material or an inorganic material can be used for the insulating layer 239.

<Structure Example 4>

Figure 9A:
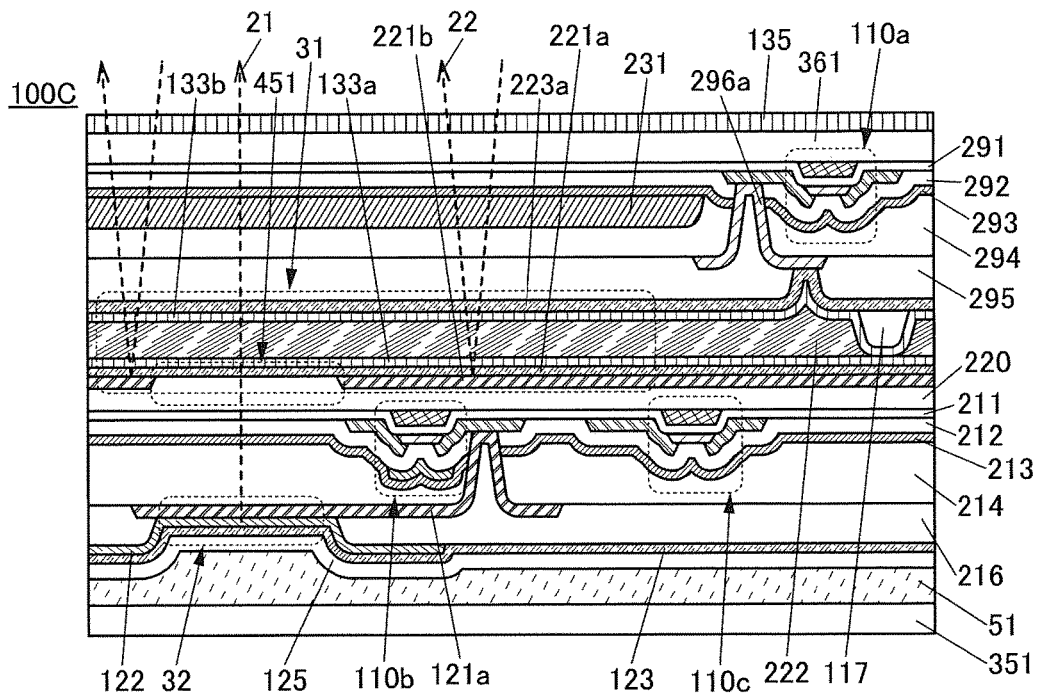
FIGS. 9A and 9B are cross-sectional views each illustrating an example of a display device.

A display device 100C illustrated in FIG. 9A is different from the display device 100 in that the EL layer 122 is separately provided for each color and the coloring layer 232 is not provided. Other components are similar to those of the display device 100 and thus are not described in detail.

In the light-emitting element 32 employing a separate coloring method, at least one layer (typified by the light-emitting layer) included in the EL layer 122 is separately provided for each color. All layers included in the EL layer may be separately provided for each color.

<Structure Example 5>

Figure 9B:
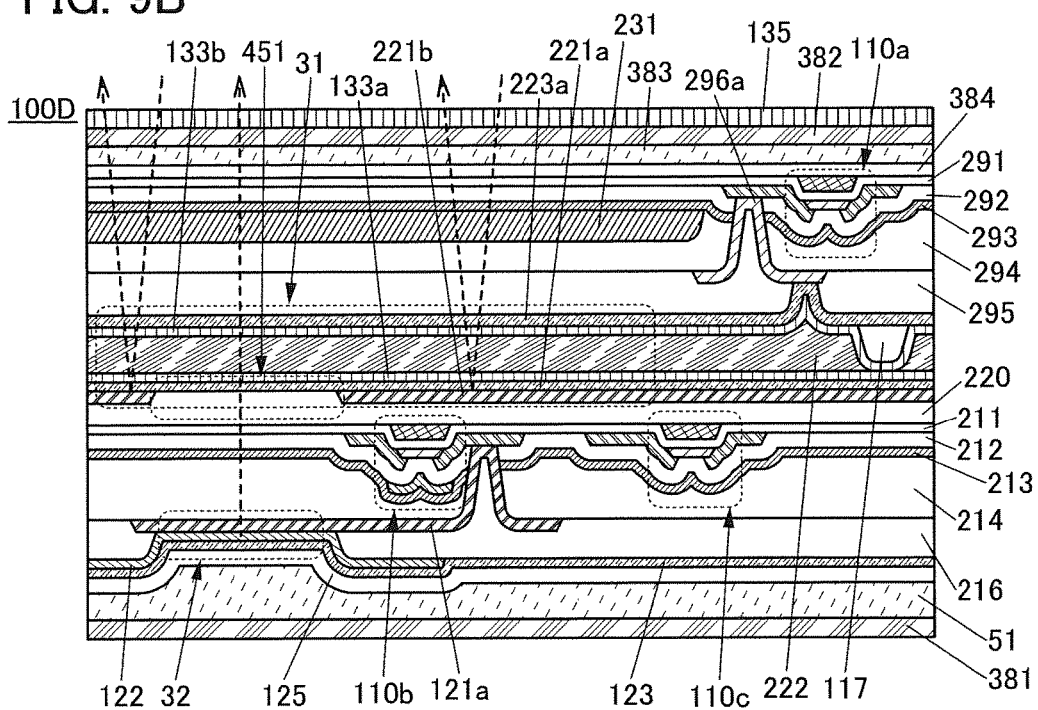

A display device 100D illustrated in FIG. 9B is different from the display device 100C in that the substrate 351 and the substrate 361 are not included and a flexible substrate 381, a flexible substrate 382, an adhesive layer 383, and an insulating layer 384 are included. Other structures are the same as those of the display device 100C and thus are not described in detail.

In manufacturing the display device 100D, for example, the insulating layer 384 is formed over a formation substrate with a separation layer therebetween, and the transistor 110a, the electrode 223a, and the like are formed over the insulating layer 384. After that, the formation substrate and the insulating layer 384 are separated from each other, and the flexible substrate 382 is bonded to the exposed insulating layer 384 with the use of the adhesive layer 383. Thus, the transistor 110a, the electrode 223a, and the like can be transferred from the formation substrate to the flexible substrate 382. Consequently, the weight and thickness of the display device can be reduced. Moreover, the flexibility of the display device can be increased. Note that the transistor 110a, the electrode 223a, and the like can be formed directly over the flexible substrate 382 depending on the heat-resistant temperature of the flexible substrate and the formation temperature of the layers to be peeled. Consequently, the weight and thickness of the display device 100 illustrated in FIG. 7 can be reduced. Moreover, the flexibility of the display device can be increased.

There is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

Figure 10A:
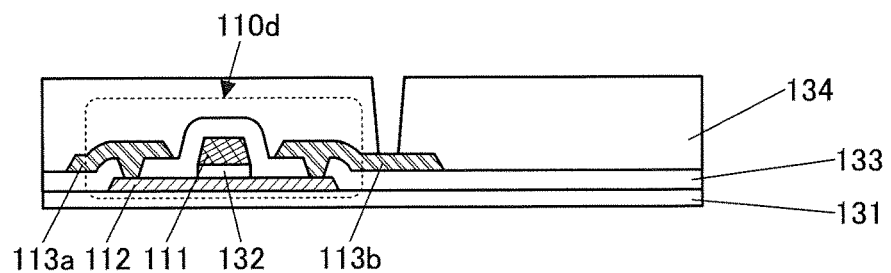
FIGS. 10A to 10C are cross-sectional views illustrating examples of transistors.
Figure 10B:
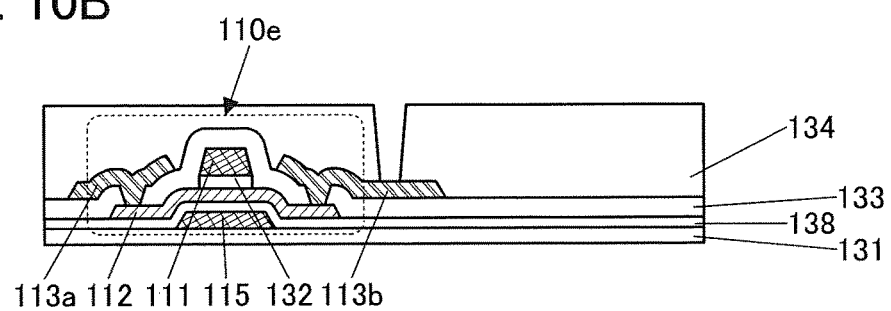
Figure 10C:
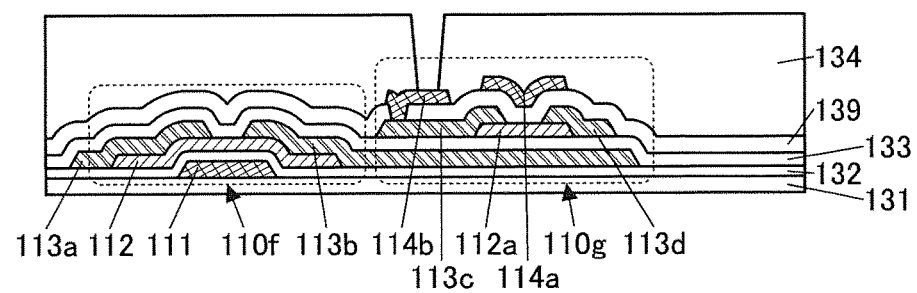

FIGS. 10A to 10C illustrate examples of transistors each having a structure different from that of the transistor 110a or the like.

A transistor 110d illustrated in FIG. 10A is a transistor having a top-gate structure.

The transistor 110d includes the conductive layer 111, an insulating layer 132, the semiconductor layer 112, an insulating layer 133, the conductive layer 113a, and the conductive layer 113b. The conductive layer 111 is provided over an insulating layer 131. The conductive layer 111 overlaps with the semiconductor layer 112 with the insulating layer 132 therebetween. The conductive layer 113a and the conductive layer 113b are electrically connected to the semiconductor layer 112 through openings provided in the insulating layer 133. The insulating layer 134 is provided over the transistor 110d. The conductive layer 113b and a pixel electrode of a display element can be electrically connected to each other through an opening provided in the insulating layer 134.

The conductive layer 111 functions as a gate. The insulating layer 132 functions as a gate insulating layer. One of the conductive layer 113a and the conductive layer 113b functions as a source and the other functions as a drain.

In the transistor 110d, the conductive layer 111 can be physically distanced from the conductive layer 113a or 113b easily; thus, the parasitic capacitance between the conductive layer 111 and the conductive layer 113a or 113b can be reduced.

A transistor 110e illustrated in FIG. 10B includes, in addition to the components of the transistor 110d, a conductive layer 115 and an insulating layer 138. The conductive layer 115 is provided over the insulating layer 131 and includes a region overlapping with the semiconductor layer 112. The insulating layer 138 covers the conductive layer 115 and the insulating layer 131.

Like the conductive layer 114, the conductive layer 115 functions as one of a pair of gates. Thus, the on-state current of the transistor can be increased and the threshold voltage can be controlled.

FIG. 10C illustrates a stacked-layer structure of a transistor 110f and a transistor 110g. The transistor 110f includes one gate. The transistor 110g includes two gates.

The transistor 110f includes the conductive layer 111 functioning as a gate, the semiconductor layer 112, and the conductive layer 113a and the conductive layer 113b functioning as a source and a drain. Part of the insulating layer 132 functions as a gate insulating layer of the transistor 110f. Part of the conductive layer 113b functions as a source or a drain of the transistor 110f.

The transistor 110g includes the conductive layer 113b functioning as a gate, a conductive layer 114a functioning as a gate, a semiconductor layer 112a, and a conductive layer 113c and a conductive layer 113d functioning as a source and a drain. Part of the insulating layer 133 functions as a gate insulating layer of the transistor 110g. Part of the conductive layer 113b functions as a gate of the transistor 110g. Part of the insulating layer 139 functions as a gate insulating layer of the transistor 110g.

The transistor 110f and the transistor 110g are preferably applied to a pixel circuit of the light-emitting element 32. For example, it is preferable to use the transistor 110f as a transistor (also referred to as a switching transistor or a selection transistor) for controlling whether a pixel is selected or not, and to use the transistor 110g as a transistor (also referred to as a driving transistor) for controlling current flowing to the light-emitting element 32.

A conductive layer 114b is electrically connected to the conductive layer 113c through an opening provided in the insulating layer 139. The conductive layer 113c and a pixel electrode of a display element can be electrically connected to each other through an opening provided in the insulating layer 134.

Hereinafter, the method for manufacturing the display device of this embodiment will be specifically described with reference to FIGS. 11 to 11C, FIGS. 12A to 12C, FIGS. 13A and 13B, and FIGS. 14A and 14B.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used.

As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV light, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

<Example of manufacturing method>

An example of a manufacturing method of the display device 100 illustrated in FIG. 7 will be described below.

Figure 11A:
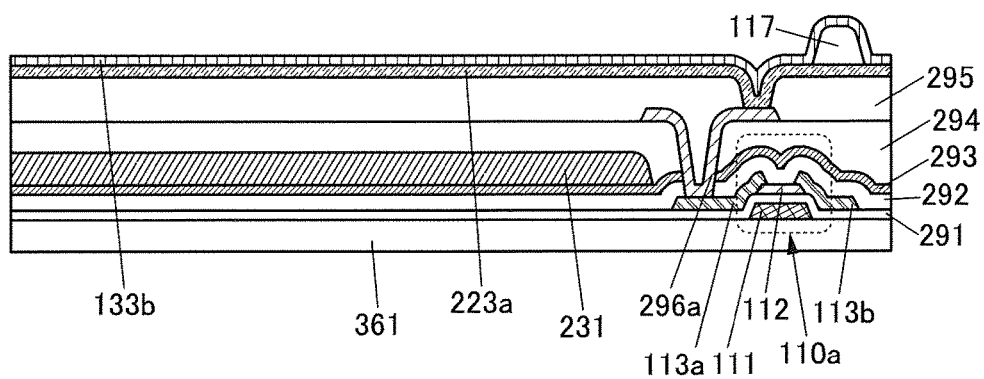
FIGS. 11A to 11C are cross-sectional views illustrating an example of a manufacturing method of a display device.

First, the transistor 110a is formed over the substrate 361 (FIG. 11A).

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

Here, the case where a bottom-gate transistor including an oxide semiconductor layer as the semiconductor layer 112 is formed is described.

An oxide semiconductor is preferably used for the semiconductor layer of the transistor. The use of a semiconductor material having a wider band gap and a lower carrier density than silicon can reduce off-state current of the transistor.

Specifically, first, the conductive layer 111 is formed over the substrate 361. The conductive layer 111 can be formed in the following manner: a conductive film is formed, a resist mask is formed, the conductive film is etched, and the resist mask is removed.

Next, the insulating layer 291 is formed.

For the insulating layer 291, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

An inorganic insulating film is preferably formed at high temperatures because the film can have higher density and a higher barrier property as the deposition temperature becomes higher. The substrate temperature during the deposition of the inorganic insulating film is preferably higher than or equal to room temperature (25° C.) and lower than or equal to 350° C., and further preferably higher than or equal to 100° C. and lower than or equal to 300° C.

Then, the semiconductor layer 112 is formed. In this embodiment, an oxide semiconductor layer is formed as the semiconductor layer 112. The oxide semiconductor layer can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen flow rate (partial pressure of oxygen) at the time of forming the oxide semiconductor film. To fabricate a transistor having high field-effect mobility, however, the percentage of oxygen flow rate (partial pressure of oxygen) at the time of forming the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

The oxide semiconductor film preferably contains at least indium or zinc. It is particularly preferable to contain indium and zinc.

The energy gap of the oxide semiconductor is preferably 2 eV or more, further preferably 2.5 eV or more, and still further preferably 3 eV or more. The use of such an oxide semiconductor having a wide energy gap leads to a reduction in off-state current of a transistor.

The oxide semiconductor film can be formed by a sputtering method. Alternatively, a PLD method, a PECVD method, a thermal CVD method, an ALD method, a vacuum evaporation method, or the like may be used.

Note that an example of an oxide semiconductor will be described in Embodiment 3.

Next, the conductive layer 113a and the conductive layer 113b are formed. The conductive layer 113a and the conductive layer 113b can be formed in the following manner: a conductive film is formed, a resist mask is formed, the conductive film is etched, and the resist mask is removed. Each of the conductive layers 113a and 113b is connected to the semiconductor layer 112.

Note that during the processing of the conductive layer 113a and the conductive layer 113b, the semiconductor layer 112 might be partly etched to be thin in a region not covered by the resist mask.

In the above manner, the transistor 110a can be fabricated (FIG. 11A). In the transistor 110a, part of the conductive layer 111 functions as a gate, part of the insulating layer 291 functions as a gate insulating layer, and the conductive layer 113a and the conductive layer 113b function as a source and a drain.

Next, the insulating layer 292 that covers the transistor 110a is formed, and the insulating layer 293 is formed over the insulating layer 292 (FIG. 11A). The insulating layer 292 and the insulating layer 293 can each be formed in a manner similar to that of the insulating layer 291.

It is preferable to use an oxide insulating film formed in an atmosphere containing oxygen, such as a silicon oxide film or a silicon oxynitride film, for the insulating layer 292. An insulating film with low oxygen diffusibility and oxygen permeability, such as a silicon nitride film, is preferably stacked as the insulating layer 293 over the silicon oxide film or the silicon oxynitride film. The oxide insulating film formed in an atmosphere containing oxygen can easily release a large amount of oxygen by heating. When a stack including such an oxide insulating film that releases oxygen and an insulating film with low oxygen diffusibility and oxygen permeability is heated, oxygen can be supplied to the oxide semiconductor layer. As a result, oxygen vacancies in the oxide semiconductor layer can be filled and defects at the interface between the oxide semiconductor layer and the insulating layer 292 can be repaired, leading to a reduction in defect levels. Accordingly, an extremely highly reliable display device can be fabricated.

Next, the coloring layer 231 is formed over the insulating layer 293. The coloring layer 231 is formed using a photosensitive material, in which case the processing into an island shape can be performed by a photolithography method or the like.

Next, the insulating layer 294 is formed over the coloring layer 231 and the insulating layer 293.

The insulating layer 294 preferably functions as a planarization layer. A resin such as acrylic or epoxy is suitably used for the insulating layer 294. Alternatively, an inorganic insulating film that can be used as the insulating layer 291 may be used as the insulating layer 294.

After that, an opening that reaches the conductive layer 113a included in the transistor 110a is formed in the insulating layer 292, the insulating layer 293, and the insulating layer 294.

Next, the conductive layer 296a is formed. The conductive layer 296a can be formed in the following manner: a conductive film is formed, a resist mask is formed, the conductive film is etched, and the resist mask is removed. Here, the conductive layer 113a included in the transistor 110a and the conductive layer 296a are connected to each other.

Next, the insulating layer 295 is formed over the insulating layer 294 and the conductive layer 296a. The insulating layer 295 preferably functions as a planarization layer. For the insulating layer 295, an organic insulating film or an inorganic insulating film that can be used for the insulating layer 294 can be used.

Next, an opening reaching the conductive layer 296a is formed in the insulating layer 295.

Next, the electrode 223a is foamed. The electrode 223a can be formed in the following manner: a conductive film is formed, a resist mask is formed, the conductive film is etched, and the resist mask is removed. Here, the conductive layer 296a and the electrode 223a are connected to each other. Thus, the conductive layer 113a included in the transistor 110a and the electrode 223a can be electrically connected to each other. The electrode 223a is formed using a conductive material that transmits visible light.

Next, the insulating layer 117 is formed over the electrode 223a. The insulating layer 117 is preferably formed using an organic insulating film.

Subsequently, the alignment film 133b is formed over the electrode 223a and the insulating layer 117 (FIG. 11A). The alignment film 133b can be formed in the following manner: a thin film is formed using a resin or the like, and then, rubbing treatment is performed.

Note that steps illustrated in FIGS. 11B and 11C, FIGS. 12A to 12C, FIGS. 13A and 13B, and FIG. 14A are performed independently of the steps described with reference to FIG. 11A.

Figure 11B:
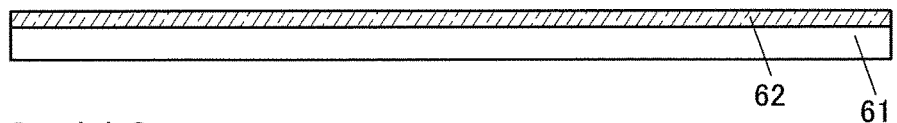

First, a separation layer 62 is formed over a formation substrate 61 (FIG. 11B).

The formation substrate 61 has stiffness high enough for easy transfer and has resistance to heat applied in the manufacturing process. Examples of a material that can be used for the formation substrate 61 include glass, quartz, ceramics, sapphire, a resin, a semiconductor, a metal, and an alloy. Examples of the glass include alkali-free glass, barium borosilicate glass, and aluminoborosilicate glass.

The separation layer 62 can be formed using an organic material or an inorganic material.

In the case where the separation layer 62 is formed using an organic material, a photosensitive material is preferably used, and a photosensitive and thermosetting material is further preferably used.

With the use of a photosensitive material, part thereof can be removed by a photolithography method. Specifically, heat treatment (also referred to as pre-baking treatment) for removing a solvent is performed after deposition of a material, and then light exposure is performed using a photomask. Next, development treatment is performed, so that an unnecessary portion is removed. After that, heat treatment (also referred to as post-baking treatment) is performed. In the post-backing treatment, heating is preferably performed at a temperature higher than or equal to formation temperatures of layers formed over the separation layer 62. For example, the heating temperature is preferably higher than or equal to 350° C. and lower than or equal to 450° C., further preferably higher than or equal to 350° C. and lower than or equal to 400° C., still further preferably higher than or equal to 350° C. and lower than or equal to 375° C. In this manner, degasification from the separation layer 62 can be significantly suppressed in the manufacturing step of the transistor.

The separation layer 62 is preferably formed using a photosensitive polyimide (PSPI) resin.

In addition, examples of an organic material that can be used for the separation layer 62 include an acrylic resin, an epoxy resin, a polyamide resin, a polyimide-amide resin, a siloxane resin, a benzocyclobutene-based resin, and a phenol resin.

The separation layer 62 is preferably formed with a spin coater. The spin coating method enables formation of a uniform thin film over a large substrate.

The separation layer 62 is preferably formed using a solution with a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the coating is. Furthermore, the lower the viscosity of the solution is, the more the entry of bubbles can be prevented, which leads to a film with good quality.

In the case of using an organic material, the thickness of the separation layer 62 is preferably greater than or equal to 0.01 µm and less than 10 µm, further preferably greater than or equal to 0.1 µm and less than or equal to 3 µm, still further preferably greater than or equal to 0.5 µm and less than or equal to 1 µm. With the use of a solution with low viscosity, the separation layer 62 can be easily made thin. When the thickness of the separation layer 62 is within the above range, the manufacturing cost can be reduced. Note that the thickness of the separation layer 62 is not limited thereto, and may be greater than or equal to 10 µm, for example, greater than or equal to 10 µm and less than or equal to 200 µm.

Alternatively, the separation layer 62 can be formed by dipping, spray coating, ink-jetting, dispensing, screen printing, or offset printing, or with a doctor knife, a slit coater, a roll coater, a curtain coater, or a knife coater, for example.

Examples of an inorganic material that can be used for the separation layer 62 include a metal containing an element selected from tungsten, molybdenum, titanium, tantalum, niobium, nickel, cobalt, zirconium, zinc, ruthenium, rhodium, palladium, osmium, iridium, and silicon, an alloy containing the element, and a compound containing the element. A crystal structure of a layer containing silicon may be amorphous, microcrystal, or polycrystal.

In the case of using an inorganic material, the thickness of the separation layer 62 is greater than or equal to 1 nm and less than or equal to 1000 nm, preferably greater than or equal to 10 nm and less than or equal to 200 nm, further preferably greater than or equal to 10 nm and less than or equal to 100 nm.

In the case of using an inorganic material, the separation layer 62 can be formed by, for example, a sputtering method, a CVD method, an ALD method, or an evaporation method.

A material for the separation layer 62 can be selected as appropriate such that peeling at the interface between the separation layer 62 and the insulating layer 220 (see FIG. 7 and the like) and the electrode 221a occurs. Alternatively, peeling may occur at the interface between the formation substrate 61 and the separation layer 62 or in the separation layer 62. For example, as the separation layer 62, a layer including a high-melting-point metal material, such as tungsten, and a layer including an oxide of the metal material may be stacked, and in addition, a plurality of layers, such as a silicon nitride layer, a silicon oxynitride layer, and a silicon nitride oxide layer may be stacked. The use of the high-melting-point metal material for the separation layer 62 can increase the formation temperature of a layer formed in a later step, which reduces impurity concentration and achieves a highly reliable display device. Note that in the case where peeling occurs at the interface between the formation substrate 61 and the separation layer 62 or in the separation layer 62, the separation layer 62 unneeded for the display device may be removed after the peeling. Alternatively, the separation layer 62 is not necessarily removed and may serve as a component of the display device.

Figure 11C:
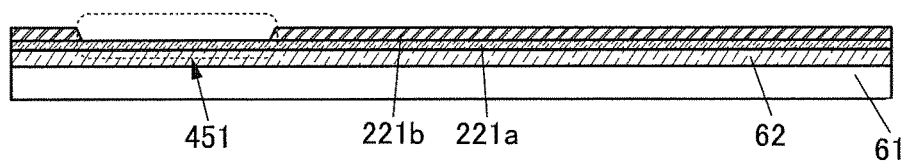

Next, the electrode 221a is formed over the separation layer 62, and the electrode 221b is formed over the electrode 221a (FIG. 11C). The electrode 221b includes the opening 451 over the electrode 221a. The electrodes 221a and 221b can each be formed in the following manner: a conductive film is formed, a resist mask is formed, the conductive film is etched, and the resist mask is removed. The electrode 221a is formed using a conductive material that transmits visible light. The electrode 221b is formed using a conductive material that reflects visible light.

Figure 12A:
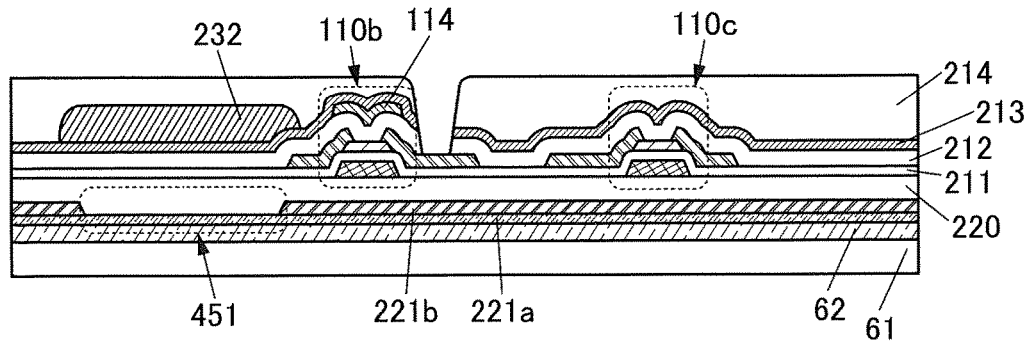
FIGS. 12A to 12C are cross-sectional views illustrating an example of a manufacturing method of a display device.

Next, the insulating layer 220 is formed (FIG. 12A).

The insulating layer 220 can be used as a barrier layer that prevents diffusion of impurities contained in the separation layer 62 into a transistor and a display element formed later. In the case where an organic material is used for the separation layer 62, it is preferable that the insulating layer 220 prevent diffusion of moisture or the like contained in the separation layer 62 into a transistor and a display element when the separation layer 62 is heated. For that reason, the insulating layer 220 preferably has a high barrier property.

An inorganic insulating film that can be used for the insulating layer 291, a resin such as an acrylic resin or an epoxy resin, or the like can be used for the insulating layer 220.

Next, the transistor 110b and the transistor 110c are formed over the insulating layer 220. The manufacturing step of the transistor 110a can be referred to for this step. The insulating layer 212 covering the transistor 110c is formed. The insulating layer 212 is formed to cover the semiconductor layer, the conductive layer functioning as a source, and the conductive layer functioning as a drain of each of the transistors 110b and 110c. Next, the conductive layer 114 of the transistor 110b is formed over the insulating layer 212. Then, the insulating layer 213 covering the transistor 110b and the transistor 110c is formed. Furthermore, the coloring layer 232 is formed over the insulating layer 213, and the insulating layer 214 is formed.

The insulating layer 211 can be formed by a method similar to that of the insulating layer 291. The insulating layer 212 can be formed by a method similar to that of the insulating layer 292.

The conductive layer 114 included in the transistor 110b can be formed in the following manner: a conductive film is formed, a resist mask is formed, the conductive film is etched, and the resist mask is removed.

The insulating layer 213 can be formed by a method similar to that of the insulating layer 293. The coloring layer 232 can be formed by a method similar to that of the coloring layer 231. The insulating layer 214 can be formed by a method similar to that of the insulating layer 294.

Next, an opening reaching a source or a drain of the transistor 110b is formed in the insulating layer 212, the insulating layer 213, and the insulating layer 214.

Figure 12B:
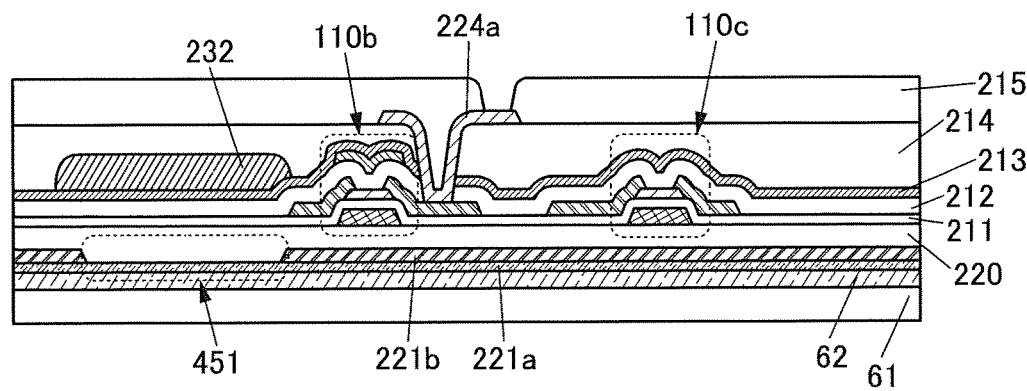

Next, the conductive layer 224a is formed (FIG. 12B). The conductive layer 224a can be formed in the following manner: a conductive film is formed, a resist mask is formed, the conductive film is etched, and the resist mask is removed. Here, the source or the drain of the transistor 110b and the conductive layer 224a are connected to each other.

Next, the insulating layer 215 is formed over the insulating layer 214 and the conductive layer 224a. The display element is formed on the insulating layer 215 in a later step; thus, the insulating layer 215 preferably functions as a planarization layer. For the insulating layer 215, an organic insulating film or an inorganic insulating film that can be used for the insulating layer 294 can be used.

Next, an opening reaching the conductive layer 224a is formed in the insulating layer 215.

Figure 12C:
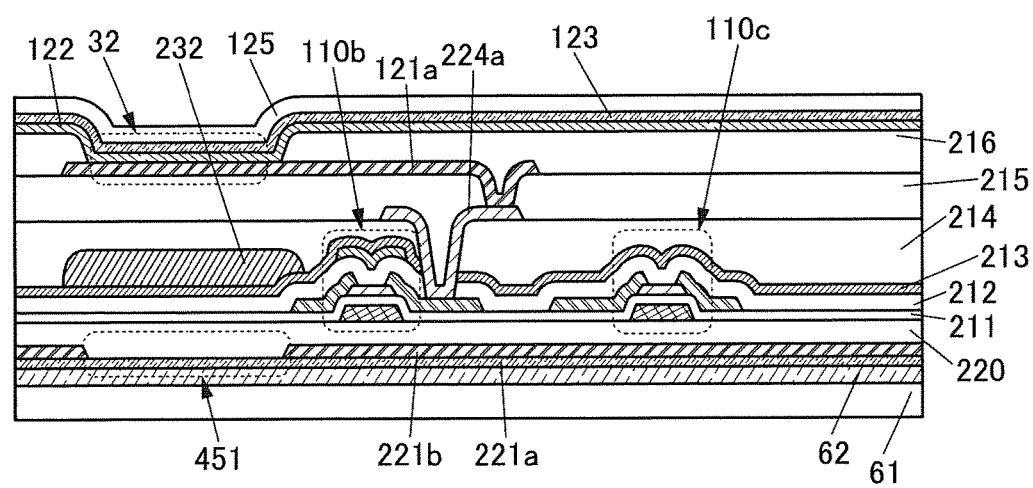

Next, the electrode 121a is formed (FIG. 12C). The electrode 121a can be formed in the following manner: a conductive film is formed, a resist mask is formed, the conductive film is etched, and the resist mask is removed. Here, the conductive layer 224a and the electrode 121a are connected to each other. Thus, the source or the drain of the transistor 110b and the electrode 121a can be electrically connected to each other. The electrode 121a is formed using a conductive material that transmits visible light.

Next, the insulating layer 216 covering an end portion of the electrode 121a is formed. For the insulating layer 216, an organic insulating film or an inorganic insulating film that can be used for the insulating layer 294 can be used. The insulating layer 216 includes an opening in a portion overlapping with the electrode 121a.

Next, the EL layer 122 and the electrode 123 are formed. Part of the electrode 123 functions as the common electrode of the light-emitting element 32. The electrode 123 is formed using a conductive material that reflects visible light.

The EL layer 122 can be formed by an evaporation method, a coating method, a printing method, a discharge method, or the like. In the case where the EL layer 122 is formed for each individual pixel, an evaporation method using a shadow mask such as a metal mask, an ink jet method, or the like can be used. In the case of sharing the EL layer 122 by some pixels, an evaporation method not using a metal mask can be used.

Either a low molecular compound or a high molecular compound can be used for the EL layer 122, and an inorganic compound may also be included.

Steps after the formation of the EL layer 122 are performed such that temperatures higher than the heat resistant temperature of the EL layer 122 are not applied to the EL layer 122. The electrode 123 can be formed by an evaporation method, a sputtering method, or the like.

In the above manner, the light-emitting element 32 can be formed (FIG. 12C). In the light-emitting element 32, the electrode 121a part of which functions as the pixel electrode, the EL layer 122, and the electrode 123 part of which functions as the common electrode are stacked.

Although an example where a bottom-emission light-emitting element is formed as the light-emitting element 32 is described here, one embodiment of the present invention is not limited thereto.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

Next, the insulating layer 125 is formed so as to cover the electrode 123. The insulating layer 125 functions as a protective layer that prevents diffusion of impurities such as water into the light-emitting element 32. The light-emitting element 32 is sealed with the insulating layer 125. After the electrode 123 is formed, the insulating layer 125 is preferably formed without exposure to the air.

The insulating layer 125 preferably includes an inorganic insulating film with a high barrier property that can be used for the insulating layer 291, for example. A stack including an inorganic insulating film and an organic insulating film can also be used.

The insulating layer 125 is preferably formed at substrate temperature lower than or equal to the heat resistant temperature of the EL layer 122. The insulating layer 125 can be formed by an ALD method, a sputtering method, or the like. An ALD method and a sputtering method are preferable because a film can be formed at low temperatures. An ALD method is preferable because the coverage of the insulating layer 125 is improved.

Figure 13A:
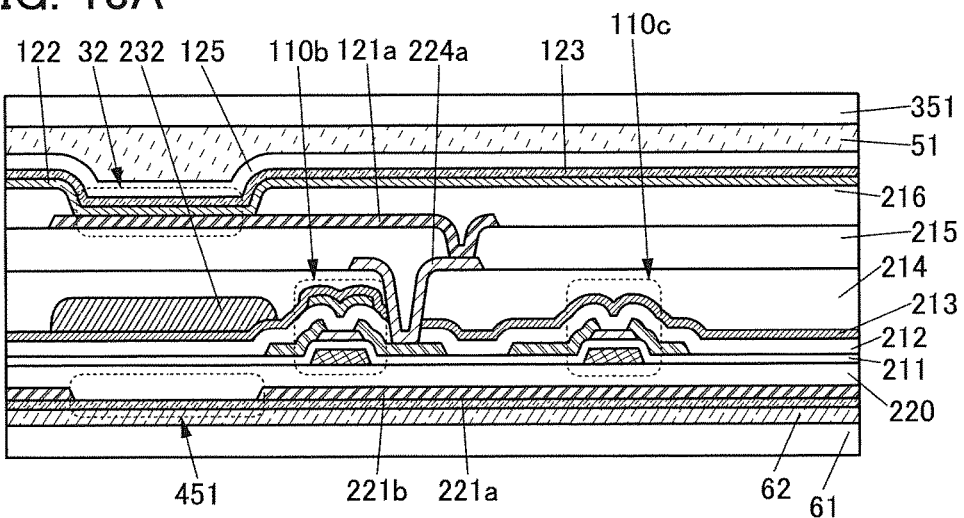
FIGS. 13A and 13B are cross-sectional views illustrating an example of a manufacturing method of a display device.

Then, the substrate 351 is bonded to a surface of the insulating layer 125 with the adhesive layer 51 (FIG. 13A).

As the adhesive layer 51, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 351, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PaE) resin, an ABS resin, or cellulose nanofiber can be used, for example. Any of a variety of materials such as glass, quartz, a resin, a metal, an alloy, and a semiconductor can be used for the substrate 351. The substrate 351 formed using any of a variety of materials such as glass, quartz, a resin, a metal, an alloy, and a semiconductor may be thin enough to be flexible.

Figure 13B:
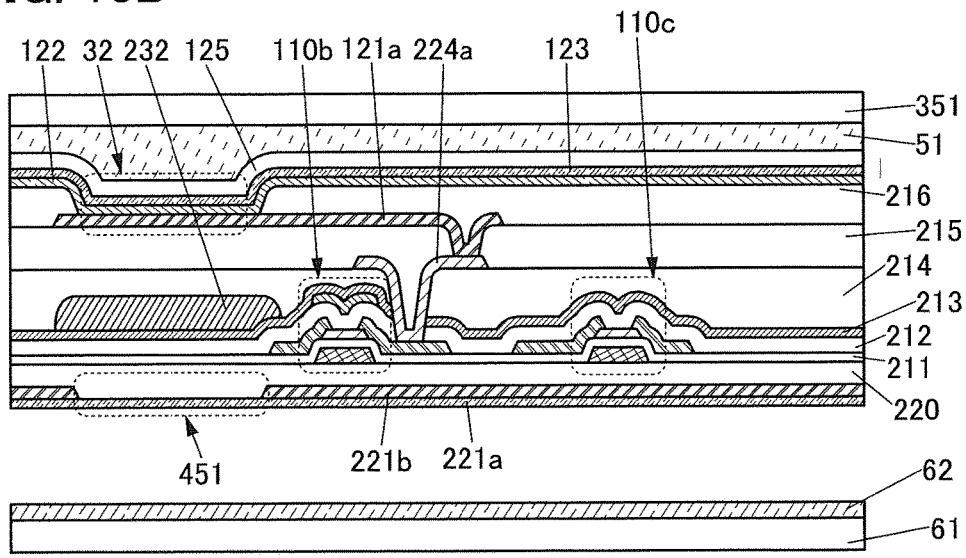

After that, the formation substrate 61 is peeled (FIG. 13B).

The position of the separation surface depends on the materials, the formation methods, and the like of the separation layer 62, the formation substrate 61, and the like.

FIG. 13B illustrates an example where the separation occurs at the interface between the separation layer 62 and the electrode 221a. By the separation, the electrode 221a is exposed.

Before the separation, a separation trigger may be formed in the separation layer 62. For example, by laser irradiation, the separation layer 62 can be embrittled or adhesion between the separation layer 62 and the electrode 221a (or the formation substrate 61) can be reduced.

The formation substrate 61 can be peeled by applying a perpendicular tensile force to the separation layer 62, for example. Specifically, the formation substrate 61 can be peeled by pulling up the substrate 351 by part of its suction-attached top surface.

The separation trigger may be formed by inserting a sharp instrument such as a knife between the separation layer 62 and the formation substrate 61. Alternatively, the separation trigger may be formed by cutting the separation layer 62 from the substrate 351 side with a sharp instrument.

In the case where separation occurs at the interface between the separation layer 62 and the formation substrate 61 or in the separation layer 62, the separation layer 62 remaining on the electrode 221a side may be removed after the formation substrate 61 is peeled. The separation layer 62 is not necessarily removed when the separation layer 62 can remain.

Figure 14A:
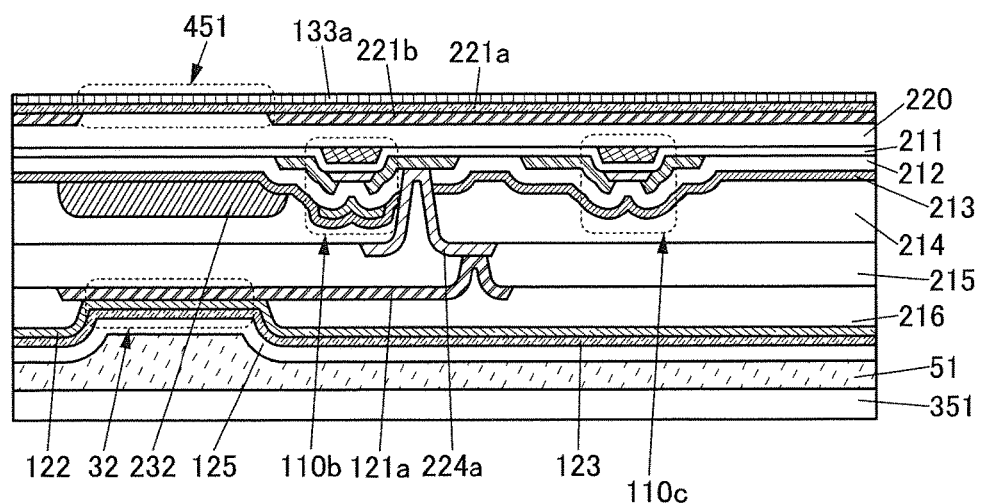
FIGS. 14A and 14B are cross-sectional views illustrating an example of a manufacturing method of a display device.

Subsequently, the alignment film 133a is formed on the exposed surface of the electrode 221a (FIG. 14A). The alignment film 133a can be formed in the following manner: a thin film is formed using a resin or the like, and then, rubbing treatment is performed.

Figure 14B:
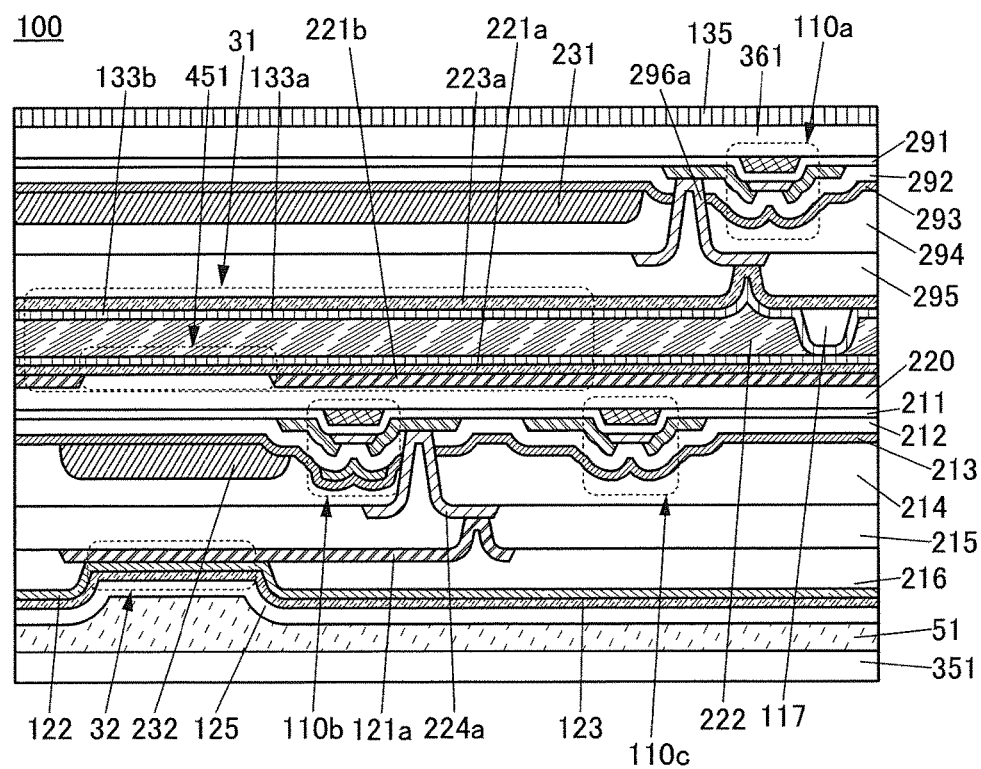

Then, the substrate 361 obtained from the steps described using FIG. 11A and the substrate 351 obtained from the steps up to the step illustrated in FIG. 14A are bonded to each other with the liquid crystal layer 222 provided therebetween (FIG. 14B). Although not illustrated in FIG. 14B, the substrate 351 and the substrate 361 are bonded to each other with the adhesive layer 141 as illustrated in FIG. 7 and other drawings. For materials of the adhesive layer 141, the description of the materials that can be used for the adhesive layer 51 can be referred to.

Through the above steps, the display device 100 can be fabricated.

The display device of this embodiment includes two types of display elements as described above; thus, switching between a plurality of display modes is possible. Accordingly, the display device can have high convenience and high visibility regardless of the ambient brightness.

This embodiment can be combined with any other embodiment as appropriate. In the case where a plurality of structure examples are described in one embodiment in this specification, some of the structure examples can be combined as appropriate.

(Embodiment 2)

In this embodiment, a more detailed structure example of the display device described in Embodiment 1 is described with reference to FIGS. 15A, 15B1, 15B2, and 15B3, FIG. 16, and FIGS. 17A and 17B.

The display device described in this embodiment includes a reflective liquid crystal element and a light-emitting element and can perform display both in a transmissive mode and in a reflective mode.

Figure 15A:
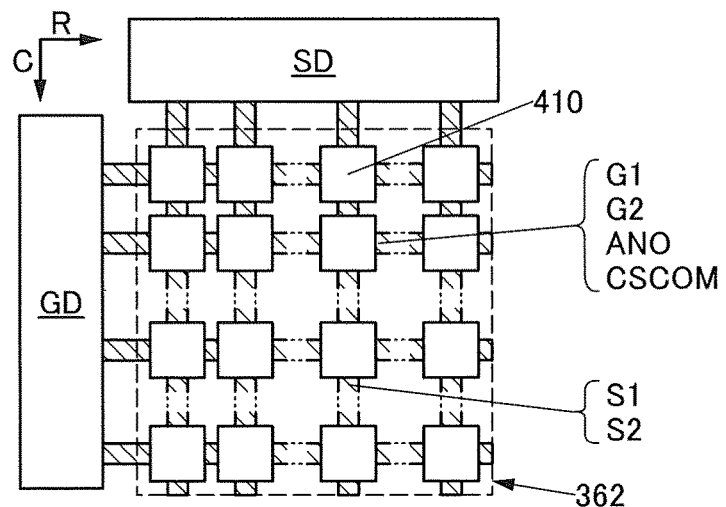
FIG. 15A illustrates an example of a display device, and FIGS. 15B1, 15B2, and 15B3 each illustrate an example of a pixel.
Figure 15A:
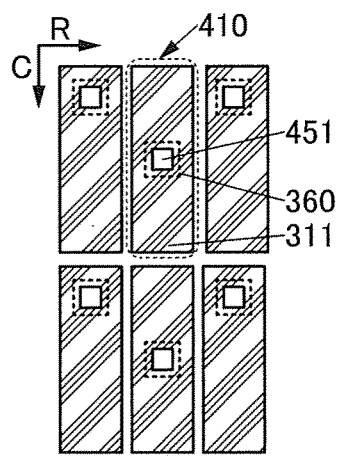
Figure 15A:
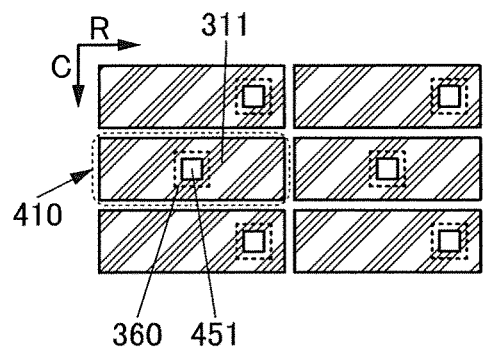
Figure 15A:
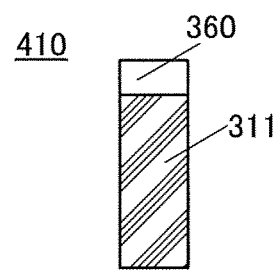

FIG. 15A is a block diagram of a display device 400. The display device 400 includes a display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings S1 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixels 410 each include a reflective liquid crystal element and a light-emitting element.

FIGS. 15B1, 15B2, and 15B3 illustrate structure examples of an electrode 311 included in the pixel 410. The electrode 311 serves as a reflective electrode of the liquid crystal element. The opening 451 is provided in the electrode 311 in FIGS. 15B1 and 15B2.

In FIGS. 15B1 and 15B2, a light-emitting element 360 positioned in a region overlapping with the electrode 311 is indicated by a broken line. The light-emitting element 360 overlaps with the opening 451 included in the electrode 311. Thus, light from the light-emitting element 360 is emitted to the display surface side through the opening 451.

In FIG. 15B1, the pixels 410 which are adjacent in the direction indicated by the arrow R are pixels emitting light of different colors. As illustrated in FIG. 15B1, the openings 451 are preferably provided in different positions in the electrodes 311 so as not to be aligned in two adjacent pixels provided in the direction indicated by the arrow R. This allows two light-emitting elements 360 to be apart from each other, thereby preventing light emitted from the light-emitting element 360 from entering a coloring layer in the adjacent pixel 410 (such a phenomenon is referred to as crosstalk). Furthermore, since two adjacent light-emitting elements 360 can be arranged apart from each other, a high-resolution display device is achieved even when EL layers of the light-emitting elements 360 are separately formed with a shadow mask or the like.

In FIG. 15B2, the pixels 410 which are adjacent in a direction indicated by the arrow C are pixels emitting light of different colors. Also in FIG. 15B2, the openings 451 are preferably provided in different positions in the electrodes 311 so as not to be aligned in two adjacent pixels provided in the direction indicated by the arrow C.

The smaller the ratio of the total area of the opening 451 to the total area except for the opening is, the brighter an image displayed using the liquid crystal element can be. Furthermore, the larger the ratio of the total area of the opening 451 to the total area except for the opening is, the brighter an image displayed using the light-emitting element 360 can be.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

As illustrated in FIG. 15B3, a light-emitting region of the light-emitting element 360 may be positioned in a region where the electrode 311 is not provided, in which case light emitted from the light-emitting element 360 is emitted to the display surface side.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a chip on glass (COG) method, a COF method, or the like can be used to mount the circuit SD on a pad electrically connected to the pixels 410. Specifically, an anisotropic conductive film can be used to mount an integrated circuit on the pad.

Figure 16:
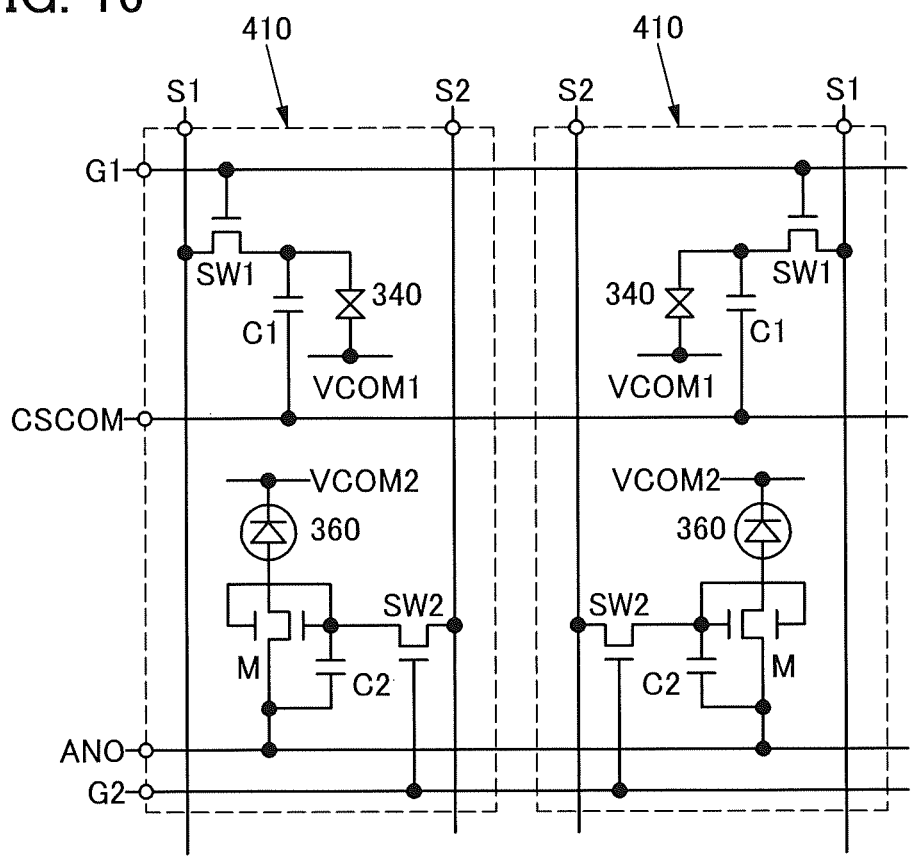
FIG. 16 is a circuit diagram illustrating an example of a pixel circuit in a display device.

FIG. 16 is an example of a circuit diagram of the pixels 410. FIG. 16 shows two adjacent pixels 410.

The pixels 410 each include a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 16 illustrates a wiring VCOM1 electrically connected to the liquid crystal element 340 and a wiring VCOM2 electrically connected to the light-emitting element 360.

FIG. 16 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. Furthermore, the other electrode of the light-emitting element 360 is connected to the wiring VCOM2.

FIG. 16 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 16, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 17A:
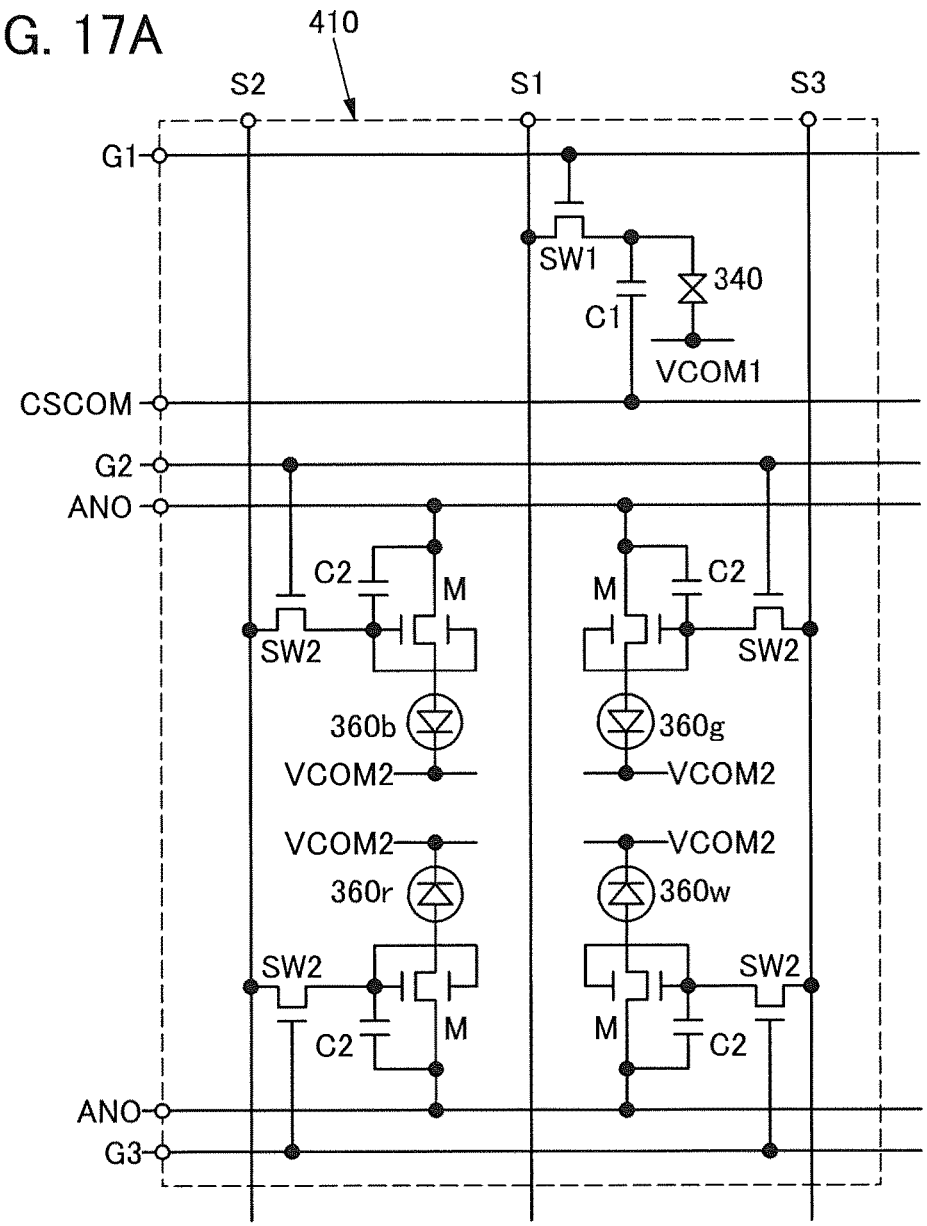
FIG. 17A is a circuit diagram illustrating an example of a pixel circuit in a display device.

Although FIG. 16 illustrates an example in which one liquid crystal element 340 and one light-emitting element 360 are provided in one pixel 410, one embodiment of the present invention is not limited thereto. FIG. 17A illustrates an example in which one liquid crystal element 340 and four light-emitting elements 360 (light-emitting elements 360r, 360g, 360b, and 360w) are provided in one pixel 410. The pixel 410 illustrated in FIG. 17A differs from that in FIG. 16 in being capable of performing full-color display with the use of the light-emitting elements by one pixel.

In FIG. 17A, in addition to the wirings in FIG. 16; a wiring G3 and a wiring S3 are connected to the pixel 410.

In the example in FIG. 17A, light-emitting elements emitting red light (R), green light (G), blue light (B), and white light (W) can be used as the four light-emitting elements 360, for example. Furthermore, as the liquid crystal element 340, a reflective liquid crystal element emitting white light can be used. Thus, in the case of performing display in the reflective mode, white display with high reflectivity can be performed. In the case of performing display in the transmissive mode, an image can be displayed with a higher color rendering property at low power consumption.

Figure 17B:
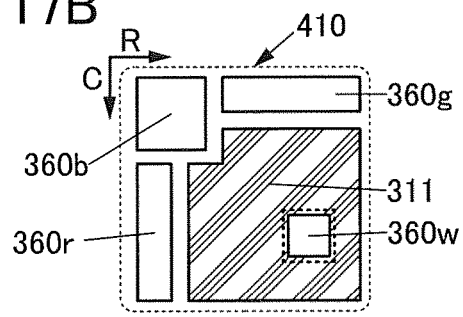
FIG. 17B is a diagram illustrating an example of a pixel.

FIG. 17B illustrates a structure example of the pixel 410 corresponding to FIG. 17A. The pixel 410 includes the light-emitting element 360w overlapping with the opening included in the electrode 311 and the light-emitting element 360r, the light-emitting element 360g, and the light-emitting element 360b which are arranged in the periphery of the electrode 311. It is preferable that the light-emitting elements 360r, 360g, and 360b have almost the same light-emitting area.

This embodiment can be combined with any of other embodiments as appropriate.

(Embodiment 3)

In this embodiment, described below is the composition of a cloud-aligned composite oxide semiconductor (CAC-OS) applicable to a transistor disclosed in one embodiment of the present invention.

The CAC-OS refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0) forming a mosaic pattern is evenly distributed in the film (this composition is also referred to as a cloud-like composition). The mosaic pattern is formed by separating the materials into InO$_{X1}$ or In$_{X2}$Zn$_{Y2}$O$_{Z2}$ and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), for example.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region is described as having higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas may be used as a deposition gas. Furthermore, the flow rate of the oxygen gas to the total flow rate of the deposition gas in deposition is preferably as low as possible, for example, the flow rate of the oxygen gas is higher than equal to 0% and lower than 30%, preferably higher than equal to 0% and lower than or equal to 10%.

The CAC-OS is characterized in that a clear peak is not observed when measurement is conducted using a θ/2θ scan by an out-of-plane method with an X-ray diffraction (XRD). That is, it is found by the XRD that there are no alignment in the a-b plane direction and no alignment in the c-axis direction in the measured areas.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is generated. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

This embodiment can be combined with any of other embodiments as appropriate.

(Embodiment 4)

In this embodiment, a display module and electronic devices of embodiments of the present invention are described.

Figure 18:
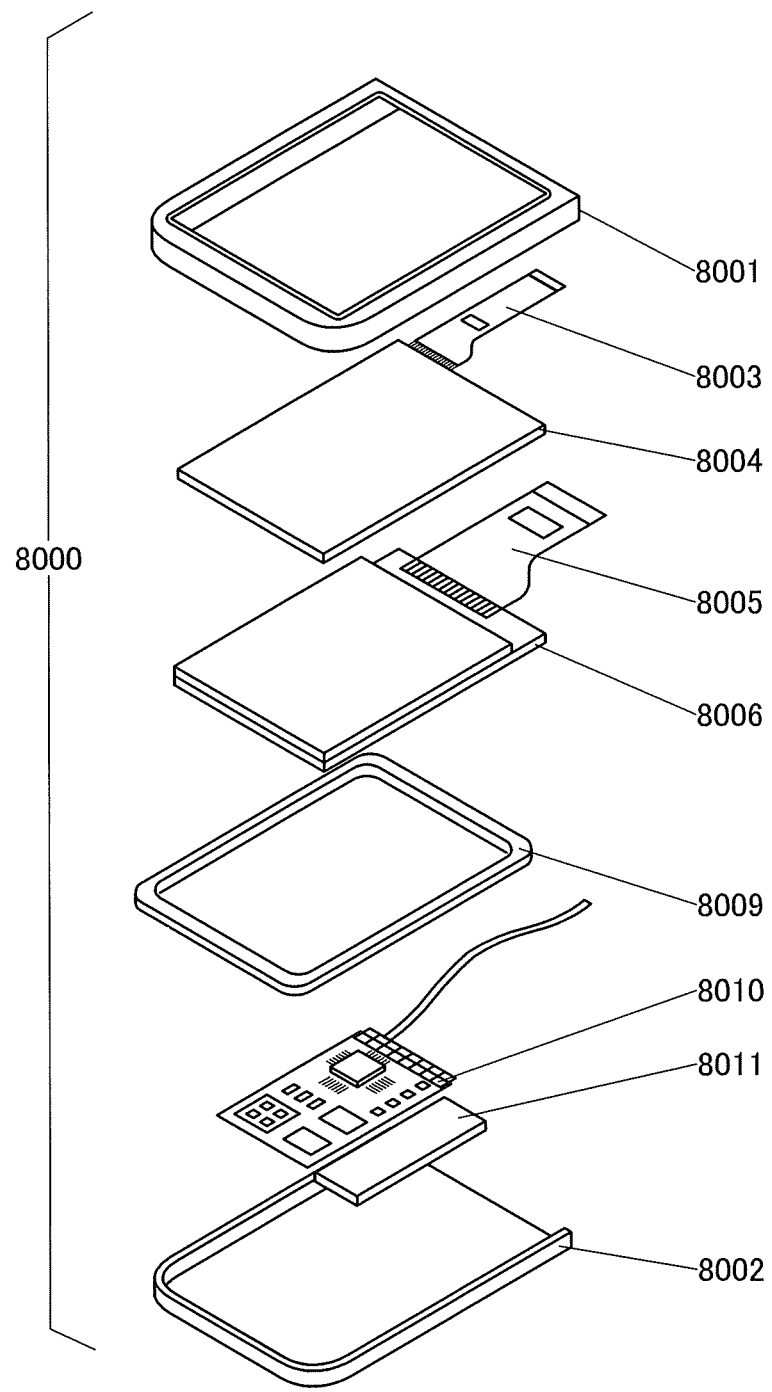
FIG. 18 illustrates an example of a display module.

In a display module 8000 in FIG. 18, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for, for example, the display panel 8006. Thus, a display module with high visibility regardless of the ambient brightness can be manufactured. Furthermore, a display module with low power consumption can be manufactured.

The shape and size of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Instead of providing the touch panel 8004, the display panel 8006 can have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 19A:
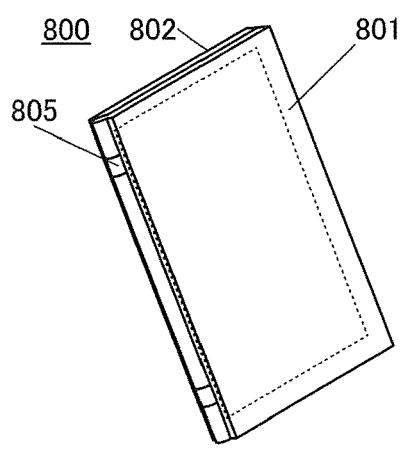
FIGS. 19A to 19D illustrate examples of electronic devices.
Figure 19B:
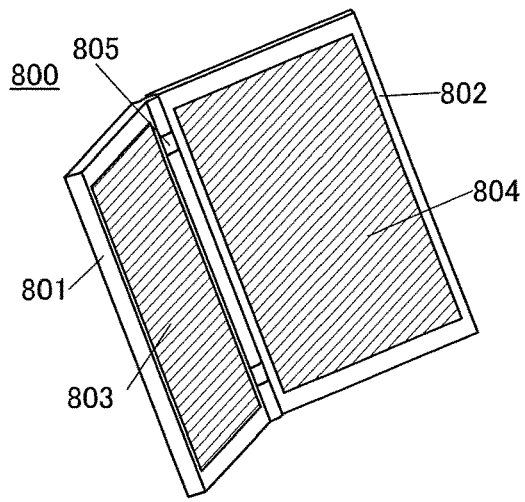

A portable information terminal 800 illustrated in FIGS. 19A and 19B includes a housing 801, a housing 802, a display portion 803, a display portion 804, a hinge portion 805, and the like.

The housing 801 and the housing 802 are joined together with the hinge portion 805. The portable information terminal 800 can be opened as illustrated in FIG. 19B from a closed state (FIG. 19A).

The display device of one embodiment of the present invention can be used for at least one of the display portion 803 and the display portion 804. Thus, a portable information terminal with high visibility regardless of the ambient brightness can be manufactured. Furthermore, a portable information terminal with low power consumption can be manufactured.

The display portion 803 and the display portion 804 can each display at least one of a text, a still image, a moving image, and the like. When a text is displayed on the display portion, the portable information terminal 800 can be used as an e-book reader.

Since the portable information terminal 800 is foldable, the portable information terminal 800 has high portability and excellent versatility.

A power button, an operation button, an external connection port, a speaker, a microphone, or the like may be provided for the housing 801 and the housing 802.

Figure 19C:
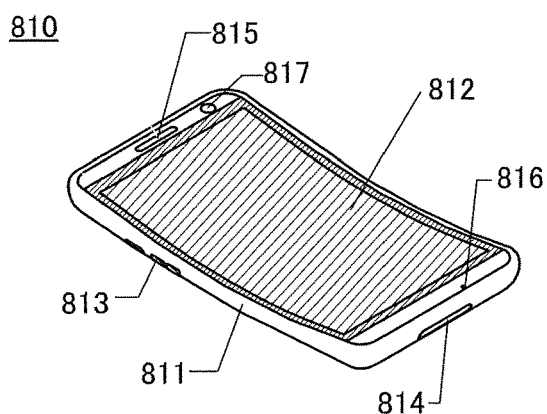

A portable information terminal 810 illustrated in FIG. 19C includes a housing 811, a display portion 812, an operation button 813, an external connection port 814, a speaker 815, a microphone 816, a camera 817, and the like.

The display device of one embodiment of the present invention can be used for the display portion 812. Thus, a portable information terminal with high visibility regardless of the ambient brightness can be manufactured. Furthermore, a portable information terminal with low power consumption can be manufactured.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 19D:
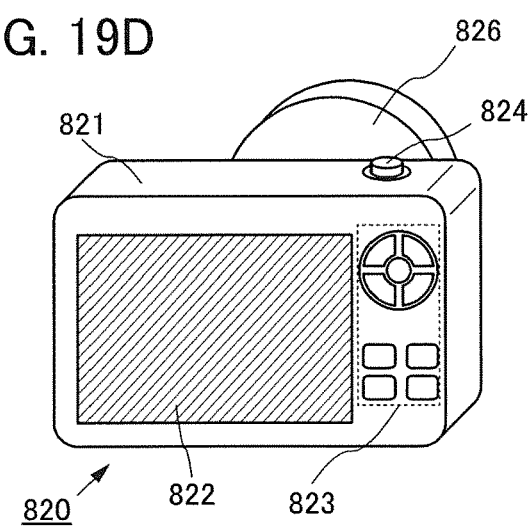

A camera 820 illustrated in FIG. 19D includes a housing 821, a display portion 822, operation buttons 823, a shutter button 824, and the like. Furthermore, an attachable lens 826 is attached to the camera 820.

The display device of one embodiment of the present invention can be used for the display portion 822. When provided with a display portion with high visibility regardless of the ambient brightness, a camera can have increased convenience. Furthermore, a camera with low power consumption can be manufactured.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which serves as a touch panel.

Note that a stroboscope, a viewfinder, or the like can be additionally attached to the camera 820. Alternatively, these may be incorporated into the housing 821.

FIGS. 20A to 20E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device of one embodiment of the present invention can be suitably used for the display portion 9001. Thus, an electronic device including a display portion with high visibility regardless of the ambient brightness can be manufactured. Furthermore, an electronic device with low power consumption can be manufactured.

The electronic devices illustrated in FIGS. 20A to 20E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 20A to 20E are not limited to the above, and the electronic devices may have other functions.

Figure 20A:
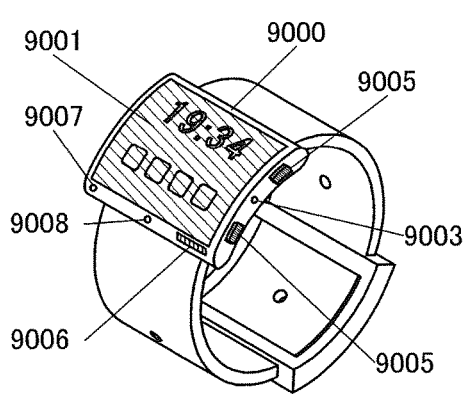
FIGS. 20A to 20E illustrate examples of electronic devices.
Figure 20B:
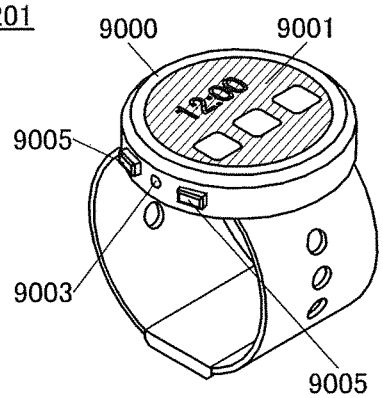

FIG. 20A is a perspective view of a watch-type portable information terminal 9200. FIG. 20B is a perspective view of a watch-type portable information terminal 9201.

The portable information terminal 9200 illustrated in FIG. 20A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal 9200 illustrated in FIG. 20A, the display surface of the display portion 9001 is not curved in the portable information terminal 9201 illustrated in FIG. 20B. Furthermore, the external state of the display portion of the portable information terminal 9201 is a non-rectangular shape (a circular shape in FIG. 20B).

Figure 20C:
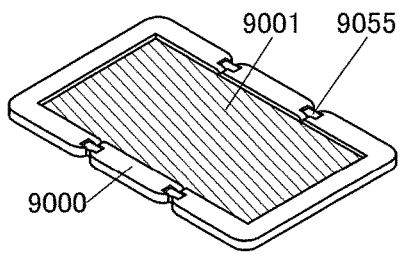
Figure 20D:
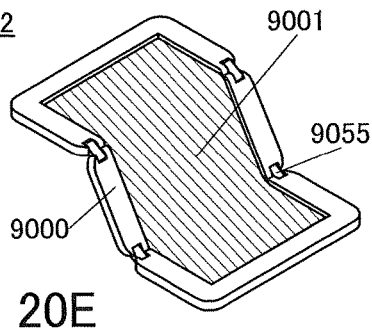
Figure 20E:
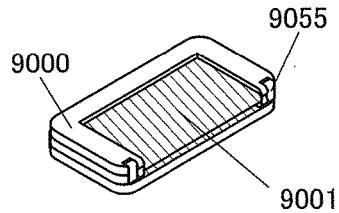

FIGS. 20C, 20D, and 20E are perspective views of a foldable portable information terminal 9202. FIG. 20C is a perspective view illustrating the portable information terminal 9202 that is opened. FIG. 20D is a perspective view illustrating the portable information terminal 9202 that is being opened or being folded. FIG. 20E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any of other embodiments as appropriate.

This application is based on Japanese Patent Application serial no. 2016-120951 filed with Japan Patent Office on Jun. 17, 2016, the entire contents of which are hereby incorporated by reference.

What is claimed is:

1. A display device comprising:
   a first display element;
   a second display element;
   a first transistor; and
   a second transistor between the first display element and the second display element,
   wherein the first display element is configured to reflect visible light,
   wherein the second display element is configured to emit visible light,
   wherein the first transistor is configured to control driving of the first display element,
   wherein the second transistor is configured to control driving of the second display element,
   wherein the first transistor is positioned closer to a display surface side of the display device than the first display element is, and
   wherein the first display element is positioned closer to the display surface side than the second display element and the second transistor are.

2. The display device according to claim 1,
   wherein the first display element comprises a reflective layer configured to reflect visible light,
   wherein the reflective layer comprises an opening,
   wherein the second display element comprises a portion overlapping with the opening, and
   wherein the second display element is configured to emit visible light toward the opening.

3. The display device according to claim 1, wherein an image is displayed using one or both of light reflected by the first display element and light emitted from the second display element.

4. The display device according to claim 1, wherein the first display element is a reflective liquid crystal element.

5. The display device according to claim 1, wherein the second display element is an electroluminescent element.

6. The display device according to claim 1, wherein one or both of the first transistor and the second transistor comprise an oxide semiconductor in a channel formation region.

7. The display device according to claim 1,
   wherein the first display element comprises a first electrode, a liquid crystal layer, and a second electrode,
   wherein the liquid crystal layer is positioned between the first electrode and the second electrode,
   wherein the first electrode is positioned closer to the display surface side than the second electrode is,
   wherein the first electrode is electrically connected to a source or a drain of the first transistor positioned closer to the display surface side than the first electrode is, and
   wherein the second electrode is electrically connected to a conductive layer positioned closer to the display surface side than the liquid crystal layer is.

8. The display device according to claim 7, further comprising an insulating layer in contact with the second electrode,
   wherein the second electrode is positioned closer to the display surface side than the insulating layer is, and
   wherein the second electrode is electrically isolated from each conductive layer that is positioned closer to a surface side facing the display surface than the insulating layer is.

9. The display device according to claim 1, further comprising an optical member,
   wherein a shortest distance between the optical member and the second transistor is longer than a shortest distance between the optical member and the first transistor, and
   wherein a shortest distance between the optical member and the second display element is longer than a shortest distance between the optical member and the first display element.

10. The display device according to claim 9, wherein the optical member comprises at least one of a polarizing plate, a light diffusion layer, and an anti-reflective layer.

11. A display module comprising:
    the display device according to claim 1; and
    a circuit board.

12. An electronic device comprising:
    the display module according to claim 11; and
    at least one of antenna, a battery, a housing, a camera, a speaker, a microphone, and an operation button.

13. A method for manufacturing a display device comprising a first display element, a second display element, a first transistor configured to control driving of the first display element, and a second transistor configured to control driving of the second display element, comprising the steps of:
    forming the first transistor and a first electrode electrically connected to a source or a drain of the first transistor over a first substrate;
    forming a separation layer over a formation substrate;
    forming a second electrode over the separation layer;
    forming a second insulating layer over the second electrode;

forming the second transistor and the second display element over the second insulating layer;

bonding the formation substrate and a second substrate to each other with an adhesive;

separating the formation substrate and the second electrode from each other; and forming the first display element by bonding the first substrate and the second substrate to each other with an adhesive so that a liquid crystal layer is positioned between the first electrode and the second electrode that is exposed, wherein the second transistor is between the first display element and the second display element.

14. The method for manufacturing a display device, according to claim 13, further comprising the steps of:

forming the second electrode configured to reflect visible light;

forming an opening in the second electrode; and forming the second display element in a position overlapping with the opening.

15. The method for manufacturing a display device, according to claim 13, wherein one or both of the first transistor and the second transistor comprise an oxide semiconductor layer as a semiconductor layer.

16. The method for manufacturing a display device, according to claim 13, wherein the adhesive used to bond the first substrate and the second substrate to each other comprises a conductive particle, wherein the first electrode and a conductive layer are formed by processing the same conductive film in the step of forming the first electrode, wherein the second electrode and the conductive layer are electrically connected to each other through the conductive particle in the step of bonding the first substrate and the second substrate to each other.

* * * * *